US011201624B2

(12) United States Patent
Haneda

(10) Patent No.: US 11,201,624 B2
(45) Date of Patent: Dec. 14, 2021

(54) CIRCUIT DEVICE, PHYSICAL QUANTITY MEASUREMENT DEVICE, ELECTRONIC APPARATUS, AND VEHICLE

(71) Applicant: Seiko Epson Corporation, Tokyo (JP)

(72) Inventor: Hideo Haneda, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/029,203

(22) Filed: Sep. 23, 2020

(65) Prior Publication Data

US 2021/0091771 A1   Mar. 25, 2021

(30) Foreign Application Priority Data

Sep. 24, 2019 (JP) ............................. JP2019-172652

(51) Int. Cl.
| | |
|---|---|
| *H03L 7/087* | (2006.01) |
| *G04F 10/00* | (2006.01) |
| *H03M 1/20* | (2006.01) |
| *H03L 7/18* | (2006.01) |
| *H03L 7/093* | (2006.01) |

(52) U.S. Cl.
CPC ............ *H03L 7/087* (2013.01); *G04F 10/005* (2013.01); *H03L 7/093* (2013.01); *H03L 7/18* (2013.01); *H03M 1/201* (2013.01)

(58) Field of Classification Search
CPC . H03L 7/087; H03L 7/093; H03L 7/18; G04F 10/005; H03M 1/201
USPC .................................. 327/147–149, 156–158
See application file for complete search history.

(56) References Cited

U.S. PATENT DOCUMENTS

| 9,041,444 B1 * | 5/2015 | Tarighat Mehrabani .................... H03L 7/1976 327/157 |
|---|---|---|
| 9,954,542 B1 * | 4/2018 | Kong ...................... H03L 7/183 |
| 10,050,634 B1 * | 8/2018 | Zhao ...................... H03L 7/091 |

(Continued)

FOREIGN PATENT DOCUMENTS

| JP | 2014-217064 A | 11/2014 |
|---|---|---|
| JP | 2015-154444 A | 8/2015 |

(Continued)

*Primary Examiner* — Adam D Houston
(74) *Attorney, Agent, or Firm* — Harness, Dickey & Pierce, P.L.C.

(57) ABSTRACT

A circuit device includes a clock generation circuit, a signal generation circuit, a phase comparison circuit, and a processing circuit. The signal generation circuit generates a first signal making the transition at a transition timing of a first clock signal, a fine-judging signal making the transition at a transition timing of a second clock signal, a first coarse-judging signal making the transition at a transition timing of the second clock signal anterior to the fine-judging signal, and a second coarse-judging signal making the transition at a transition timing of the second clock signal posterior to the fine-judging signal. The phase comparison circuit performs the phase comparison between the second signal making the transition based on the first signal and each of the fine-judging signal, the first coarse-judging signal, and the second coarse-judging signal. The processing circuit sets the transition timing of the first signal and the transition timing of the fine-judging signal based on the phase comparison result, and converts a time difference between the first signal and the second signal into a digital value based on the setting result.

15 Claims, 19 Drawing Sheets

(56) References Cited

U.S. PATENT DOCUMENTS

| | | | |
|---|---|---|---|
| 10,236,895 B1* | 3/2019 | Rogers | H03L 7/081 |
| 10,895,850 B1* | 1/2021 | Elkholy | H03M 3/368 |
| 2012/0242384 A1* | 9/2012 | Kato | H03L 7/097 |
| | | | 327/157 |
| 2014/0002151 A1* | 1/2014 | Watabe | H03L 7/081 |
| | | | 327/156 |
| 2014/0320324 A1 | 10/2014 | Canard et al. | |
| 2016/0211855 A1* | 7/2016 | Unruh | H04B 1/40 |
| 2016/0226443 A1* | 8/2016 | Caffee | H03B 5/12 |
| 2017/0264303 A1* | 9/2017 | Sekido | H03L 7/081 |
| 2018/0048322 A1* | 2/2018 | Katyal | H03L 7/097 |
| 2018/0088160 A1 | 3/2018 | Maki et al. | |
| 2018/0091156 A1 | 3/2018 | Maki et al. | |
| 2018/0091158 A1 | 3/2018 | Sudo et al. | |
| 2018/0115410 A1* | 4/2018 | Tajalli | H04L 7/0087 |
| 2018/0254774 A1* | 9/2018 | Thijssen | H03L 7/0805 |
| 2018/0302214 A1* | 10/2018 | Terlemez | H04L 7/0334 |
| 2018/0351558 A1* | 12/2018 | Kuo | G04F 10/005 |
| 2019/0044774 A1* | 2/2019 | Crols | H04W 56/0015 |
| 2019/0296747 A1* | 9/2019 | Mosalikanti | H03L 1/00 |
| 2019/0310587 A1* | 10/2019 | Kim | H03L 7/0893 |
| 2019/0356324 A1* | 11/2019 | Jenkins | H03K 21/02 |
| 2020/0195263 A1* | 6/2020 | Khoury | H03L 7/1974 |
| 2020/0212916 A1* | 7/2020 | Moe | H03L 7/0812 |
| 2020/0287557 A1* | 9/2020 | Horovitz | H03L 7/07 |
| 2021/0013888 A1* | 1/2021 | Kim | H03L 7/095 |
| 2021/0013891 A1* | 1/2021 | Wicpalek | H03L 7/093 |
| 2021/0091771 A1* | 3/2021 | Haneda | H03L 7/18 |
| 2021/0112641 A1* | 4/2021 | Li | H05B 45/325 |
| 2021/0184682 A1* | 6/2021 | Tak | H03L 7/0891 |
| 2021/0184684 A1* | 6/2021 | Oh | G01S 7/4865 |

FOREIGN PATENT DOCUMENTS

| | | |
|---|---|---|
| JP | 2018-054595 A | 4/2018 |
| JP | 2018-056677 A | 4/2018 |
| JP | 2018-056984 A | 4/2018 |
| JP | 2018-056985 A | 4/2018 |

* cited by examiner

CIRCUIT DEVICE, PHYSICAL QUANTITY MEASUREMENT DEVICE, ELECTRONIC APPARATUS, AND VEHICLE

The present application is based on, and claims priority from JP Application Serial Number 2019-172652, filed Sep. 24, 2019, the disclosure of which is hereby incorporated by reference herein in its entirety.

BACKGROUND

1. Technical Field

The present disclosure relates to a circuit device, a physical quantity measurement device, an electronic apparatus, a vehicle, and so on.

2. Related Art

Since the past, there has been known a time digital conversion circuit for converting a time difference in transition timing between a start signal and a stop signal into a digital value. Related art of such a time digital conversion circuit is disclosed in JP-A-2018-56677 (Document 1). The time digital conversion circuit in Document 1 generates the start signal by itself at a transition timing of a first clock signal after predetermined clock cycles have elapsed from the synchronizing timing of the first clock signal and a second clock signal. Then, the time digital conversion circuit compares the phase of the stop signal and the phase of the second clock signal with each other, and then updates the clock cycle until the timing at which the phases coincide with each other to thereby measure the time difference between the start signal and the stop signal.

The time digital conversion circuit described above defines a period from the synchronizing timing of the first clock signal and the second clock signal to the subsequent synchronizing timing as one measurement period, and when the phase of the stop signal and the phase of the second clock signal fail to coincide with each other in the measurement period, the time digital conversion circuit updates the clock cycle of the start signal, and then makes the transition to the subsequent measurement period. Therefore, when attempting to increase the resolution of the time measurement, or attempting to broaden the dynamic range of the time measurement, the number of times of repeating the measurement period increases, and therefore, there arises a problem that the time measurement cannot be achieved in a small amount of time.

SUMMARY

An aspect of the present disclosure relates to a circuit device including a clock generation circuit configured to generate a first clock signal and a second clock signal different in frequency from the first clock signal, a signal generation circuit configured to generate a first signal making a transition at a transition timing of the first clock signal, a fine-judging signal making a transition at a transition timing of the second clock signal, a first coarse-judging signal making a transition at a transition timing of the second clock signal anterior to the fine-judging signal, and a second coarse-judging signal making a transition at a transition timing of the second clock signal posterior to the fine-judging signal, a phase comparison circuit configured to perform a phase comparison between a second signal making a transition based on the first signal and the fine-judging signal to thereby output a first phase comparison signal, perform a phase comparison between the second signal and the first coarse-judging signal to thereby output a second phase comparison signal, and perform a phase comparison between the second signal and the second coarse-judging signal to thereby output a third phase comparison signal, and a processing circuit configured to set a transition timing of the first signal and a transition timing of the fine-judging signal based on the first phase comparison signal, the second phase comparison signal, and the third phase comparison signal, and then convert a time difference between the first signal and the second signal into a digital value based on a result of the setting.

DESCRIPTION OF AN EXEMPLARY EMBODIMENT

Hereinafter, a preferred embodiment of the present disclosure will be described in detail. It should be noted that the embodiment described hereinafter does not unreasonably limit the content of the present disclosure as set forth in the appended claims, and all of the constituents described in the present embodiment are not necessarily essential constituents.

1. First Configuration Example

Figure 1:
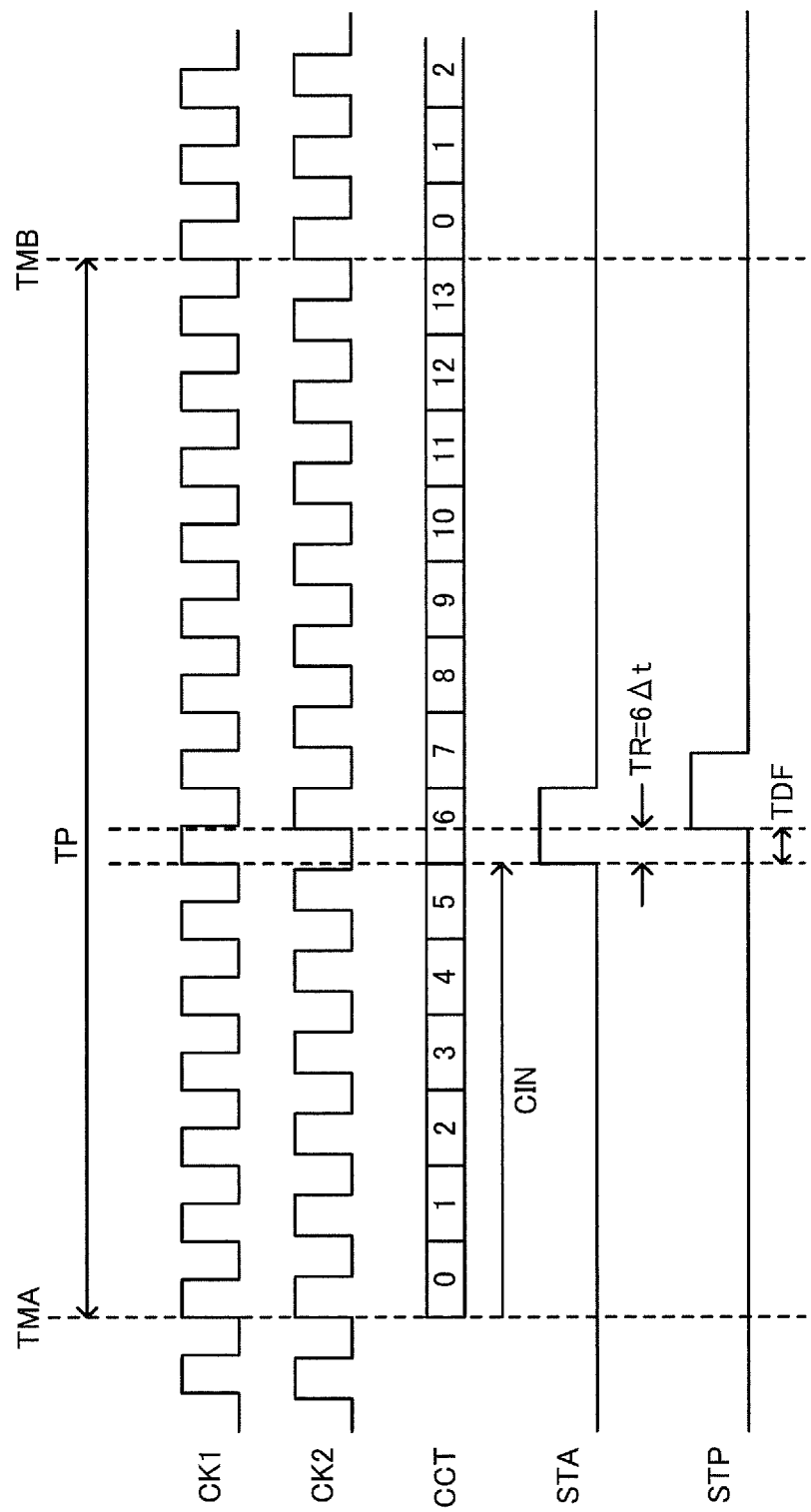
FIG. 1 is a diagram showing a signal waveform example when a time measurement method in an embodiment is not used.

Firstly, a problem in a time digital conversion circuit when a time measurement method in the present embodiment is not used will be described. FIG. 1 shows a signal waveform example when the time measurement method in the present embodiment is not used.

Defining the frequency of a clock signal CK1 as f1, and the frequency of a clock signal CK2 as f2, the frequency f1 is higher than the frequency f2. The period of the clock signal CK2 is longer than the period of the clock signal CK1, and the difference therebetween is expressed as $\Delta t = 1/f2 - 1/f1$. The time digital conversion circuit measures the time difference in transition timing between a first signal STA and a second signal STP using the difference $\Delta t$ in period as the resolution. The transition timing denotes the timing at which a signal level changes, and is a rising edge or a falling edge of the signal. Hereinafter, it is assumed that the transition timing is the rising edge.

The time digital conversion circuit performs the measurement operation described hereinafter in a period TP from the timing TMA at which the edge of the clock signal CK1 and the edge of the clock signal CK2 are synchronized with each other to the timing TMB at which the edges are subsequently synchronized with each other.

Specifically, the time digital conversion circuit starts to count the number of the clocks of the clock signal CK1 at the synchronizing timing TMA. The count value is defined as CCT. The time digital conversion circuit holds the clock count CIN of the clock signal CK1 as a variable, and makes the transition of the signal level of the first signal STA when the count value CCT coincides with the clock count CIN. In FIG. 1, CIN=6 is assumed.

As a response to the transition of the signal level of the first signal STA, the transition of the signal level of the second signal STP is made. The time digital conversion circuit compares the transition timing of the second signal STP and the transition timing of the clock signal CK2 with each other. In this comparison, there is used the transition timing of the CIN-th clock signal CK2 counted from the synchronizing timing TMA. The time difference in transition timing between the first signal STA and the clock signal CK2 is expressed as TR=6$\Delta t$. The time digital conversion circuit outputs the clock count CIN as the measurement result when the transition timing of the second signal STP and the transition timing of the clock signal CK2 coincide with each other. Specifically, the time difference in transition timing between the first signal STA and the second signal STP is expressed as TDF=CIN×$\Delta t$=6×$\Delta t$.

Although in FIG. 1, there is illustrated when the transition timing of the second signal STP and the transition timing of the clock signal CK2 coincide with each other, the clock count CIN as the variable is changed from an initial value in the actual measurement. For example, assuming the initial value as zero, the time digital conversion circuit repeats the measurement operation described above while increasing the clock count CIN by 1 in such a manner as 0, 1, 2, . . . . Then, when CIN=6 is reached, namely in the seventh measurement operation, the transition timing of the second signal STP and the transition timing of the clock signal CK2 coincide with each other. Therefore, it takes 7×TP until the measurement terminates as a result.

Although in FIG. 1, it is assumed that the dynamic range is set as 13×$\Delta t$ in order to simplify the illustration, the dynamic range in the actual measurement is broader than this. For example, assuming the dynamic range as 10000×$\Delta t$, since the measurement operation is repeated up to 10000 times, it takes up to 10000×TP until the measurement terminates as a result. When a broader dynamic range is necessary, the measurement time becomes longer. Further, when increasing the resolution of the time measurement, the measurement time also becomes longer. Assuming that, for example, the resolution is set as ½×$\Delta t$ without changing the dynamic range, since 10000×$\Delta t$=20000×(½×$\Delta t$) is true, it takes up to 20000×TP until the measurement terminates, and thus, the measurement time doubles.

As described above, in the time measurement method shown in FIG. 1, when attempting to increase the resolution of the time measurement, or attempting to broaden the dynamic range of the time measurement, the number of times of repeating the measurement period increases, and therefore, there arises a problem that the time measurement cannot be achieved in a small amount of time.

Figure 2:
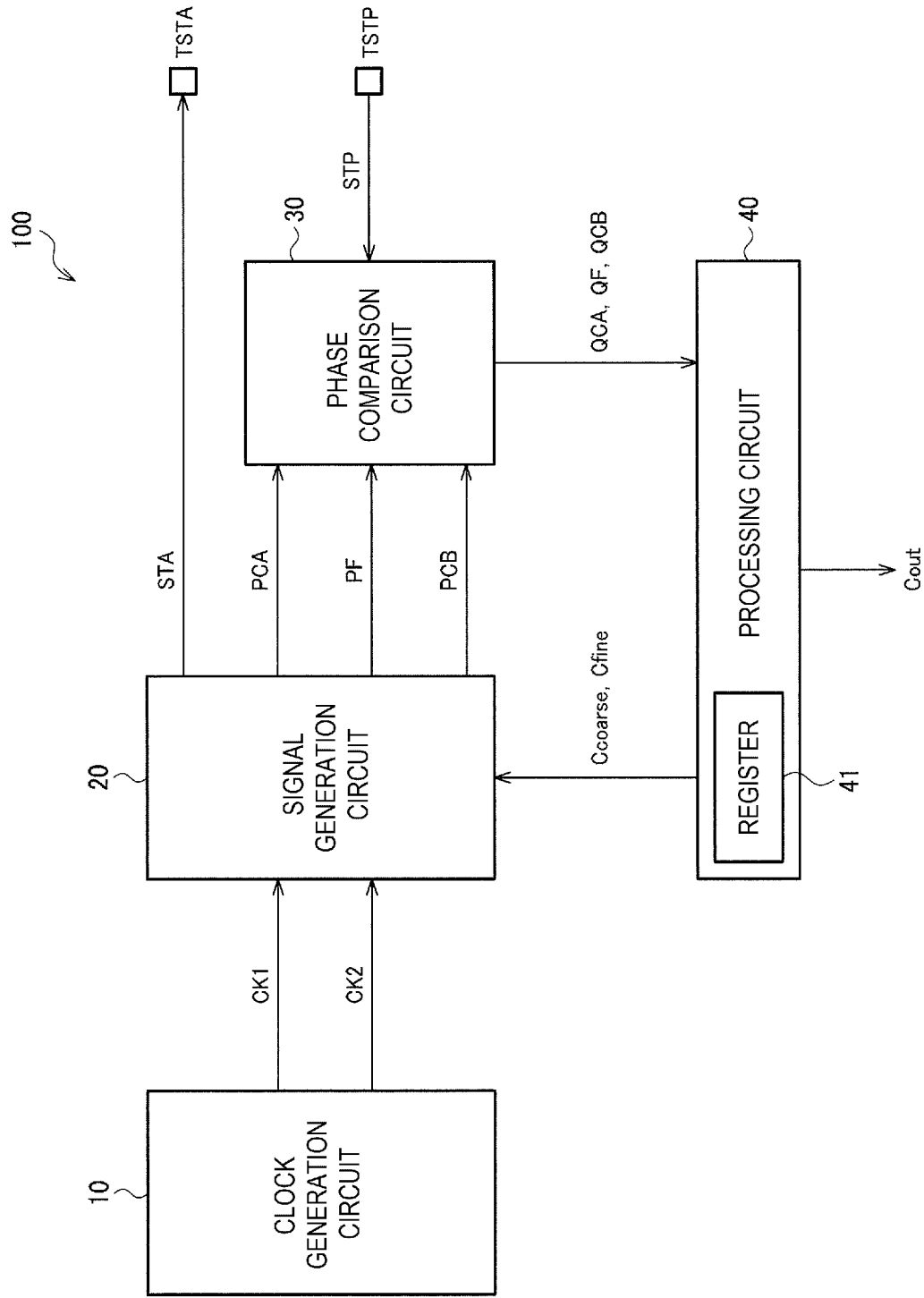
FIG. 2 is a diagram showing a first configuration example of a circuit device.
Figure 3:
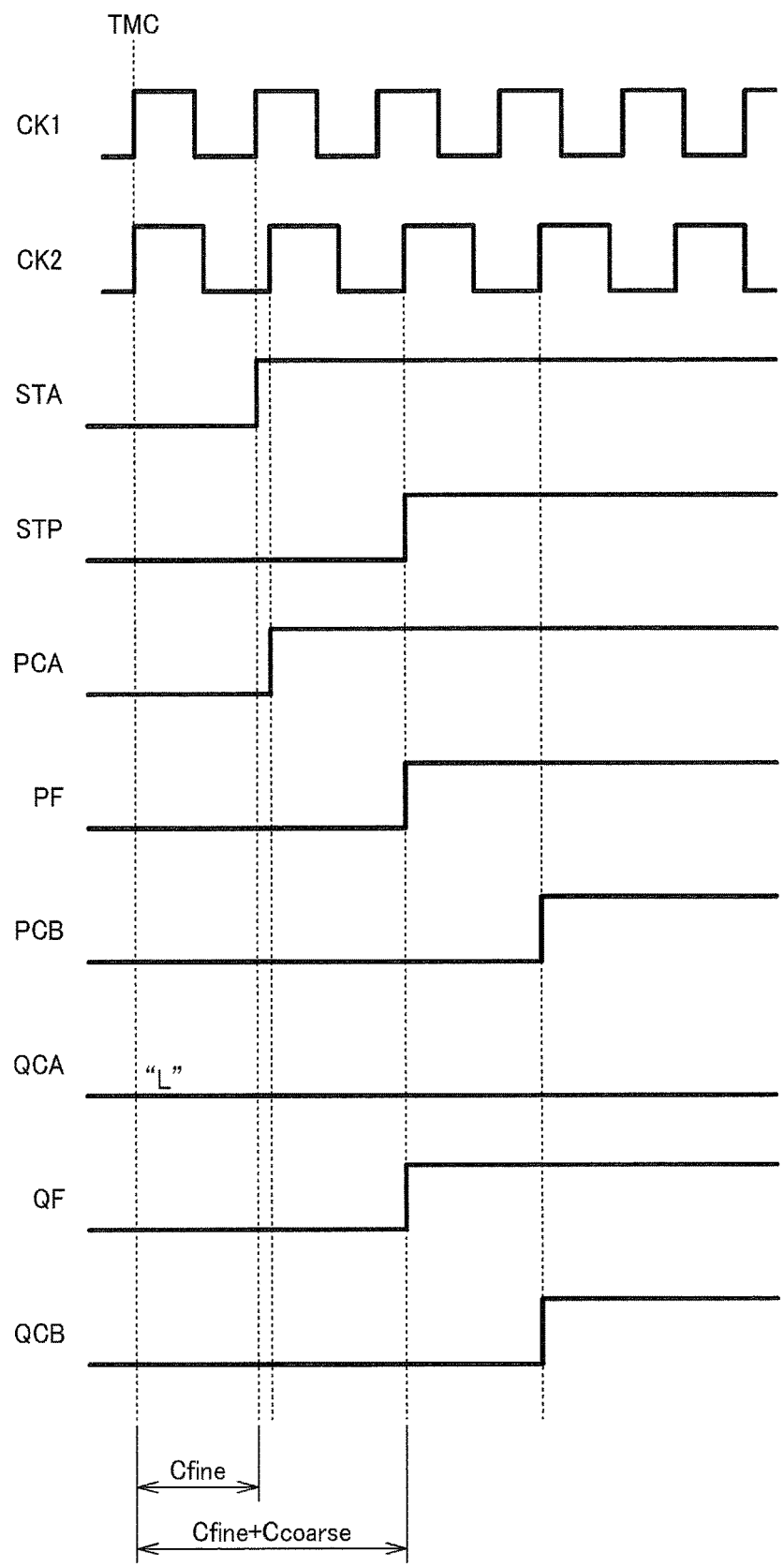
FIG. 3 is a diagram showing a first waveform example for explaining an operation of the circuit device.

A configuration and an operation of a circuit device 100 in the present embodiment will be described. FIG. 2 shows a first configuration example of the circuit device 100. FIG. 3 shows a first waveform example for explaining the operation of the circuit device 100.

The circuit device 100 includes a clock generation circuit 10, a signal generation circuit 20, a phase comparison circuit 30, a processing circuit 40, a terminal TSTA, and a terminal TSTP. The circuit device 100 is an integrated circuit device called an IC (Integrated Circuit). For example, the circuit device 100 is an IC manufactured using a semiconductor process, and a semiconductor chip having circuit elements formed on a semiconductor substrate. The terminal TSTA, TSTP are each, for example, a pad formed on a semiconductor substrate.

The clock generation circuit 10 generates the clock signal CK1 as a first clock signal, and the clock signal CK2 as a second clock signal. Similarly to FIG. 1, the frequency of the clock signal CK1 is higher than the frequency of the clock signal CK2, and a difference in period between the clock signal CK1 and the clock signal CK2 is $\Delta t$. The synchronizing timing at which the phase of the clock signal CK1 and the phase of the clock signal CK2 are synchronized with each other is defined as TMC. The synchronizing timing denotes the timing at which the anteroposterior relationship between the transition timing of the clock signal CK1 and the transition timing of the clock signal CK2 switches, and it is not necessarily required for the transition timing of the clock signal CK1 and the transition timing of the clock signal CK2 to coincide with each other at the synchronizing timing.

The signal generation circuit 20 generates the first signal STA which makes the transition at the transition timing of the clock signal CK1, and then outputs the first signal STA to the terminal TSTA. Specifically, the signal generation circuit 20 makes the transition of the first signal STA at the transition timing in the clock count Cfine of the clock signal CK1 from the synchronizing timing TMC. The clock count Cfine is a first clock count, and an example assuming Cfine=1 is shown in FIG. 3.

Further, the signal generation circuit 20 generates a judging signal PF as a fine-judging signal. The judging signal PF makes the transition at the transition timing of the clock signal CK2. Specifically, the signal generation circuit 20 makes the transition of the judging signal PF at the transition timing in the clock count Cfine+Ccoarse of the clock signal CK2 from the synchronizing timing TMC. The clock count Ccoarse is a second clock count, and an example assuming Cfine+Ccoarse=2 is shown in FIG. 3.

Further, the signal generation circuit 20 generates a judging signal PCA as a first coarse-judging signal, and a judging signal PCB as a second coarse-judging signal. The judging signal PCA makes the transition at the transition timing of the clock signal CK2 anterior to the judging signal PF. The judging signal PCB makes the transition at the transition timing of the clock signal CK2 posterior to the judging signal PF. Specifically, the signal generation circuit 20 makes the transition of the judging signal PCA at the transition timing in the clock count Cfine+Ccoarse−1 of the clock signal CK2 from the synchronizing timing TMC, and makes the transition of the judging signal PCB at the transition timing in the clock count Cfine+Ccoarse+1 of the clock signal CK2 from the synchronizing timing TMC.

To the phase comparison circuit 30, there is input the second signal STP from the terminal TSTP. The second signal STP makes the transition based on the transition of the first signal STA. The first signal STA is also called a start signal, and the second signal STP is also called a stop signal. For example, the physical quantity measurement device including the circuit device 100 emits a light pulse or an ultrasonic pulse at the transition timing of the first signal STA output from the terminal TSTA, and then receives the light pulse or the ultrasonic pulse reflected by the measurement target. The physical quantity measurement device generates the second signal STP making the transition at the transition timing of the light pulse or the ultrasonic pulse thus received, and then input the second signal STP to the terminal TSTP.

The phase comparison circuit 30 performs phase comparison between the second signal STP and the judging signal PF to thereby output a phase comparison signal QF, performs the phase comparison between the second signal STP and the judging signal PCA to thereby output a phase comparison signal QCA, and performs the phase comparison between the second signal STP and the judging signal PCB to thereby output a phase comparison signal QCB. The phase comparison signals QF, QCA, and QCB are a first phase comparison signal, a second phase comparison signal, and a third phase comparison signal, respectively. The phase comparison means to perform comparison in transition timing between the two signals.

Specifically, the phase comparison circuit 30 makes the transition of the phase comparison signal QF at the transition timing of the judging signal PF when the second signal STP makes the transition before the transition timing of the judging signal PF. Similarly, the phase comparison circuit 30 makes the transition of the phase comparison signals QCA, QCB at the transition timings of the judging signals PCA, PCB when the second signal STP makes the transition before the transition timings of the judging signals PCA, PCB. In FIG. 3, the second signal makes the transition at the transition timing of the clock count of 2 of the clock signal CK2 from the synchronizing timing TMC. In this example, the phase comparison signals QF, QCB make the transition from a low level to a high level at the transition timings of the judging signals PF, PCB, respectively. The phase comparison signal QCA is kept in the low level without making the transition.

The processing circuit 40 sets the transition timing of the first signal STA and the transition timing of the judging signal PF based on the phase comparison signals QF, QCA, and QCB. Specifically, the processing circuit 40 includes a register 41 for respectively storing the clock counts Cfine, Ccoarse. The processing circuit 40 sets the clock counts Cfine, Ccoarse based on the phase comparison signals QF, QCA, and QCB, and then writes the clock counts Cfine, Ccoarse into the register 41 to thereby update the clock counts.

The processing circuit 40 outputs the clock counts Cfine, Ccoarse stored in the register 41 to the signal generation circuit 20. The signal generation circuit 20 generates the first signal STA and the judging signals PF, PCA, and PCB based on the clock counts Cfine, Ccoarse from the processing circuit 40.

Further, the processing circuit 40 outputs a digital value Cout representing the time difference between the first signal STA and the second signal STP based on the clock counts Cfine, Ccoarse stored in the register 41. The digital value is expressed as Cout=N×Ccoarse+Cfine. The character N represents the clock count of the clock signal CK1 in the period from the synchronizing timing of the clock signal CK1 and the clock signal CK2 to the next synchronizing timing. The value N is an integer equal to or greater than 2.

Figure 4:
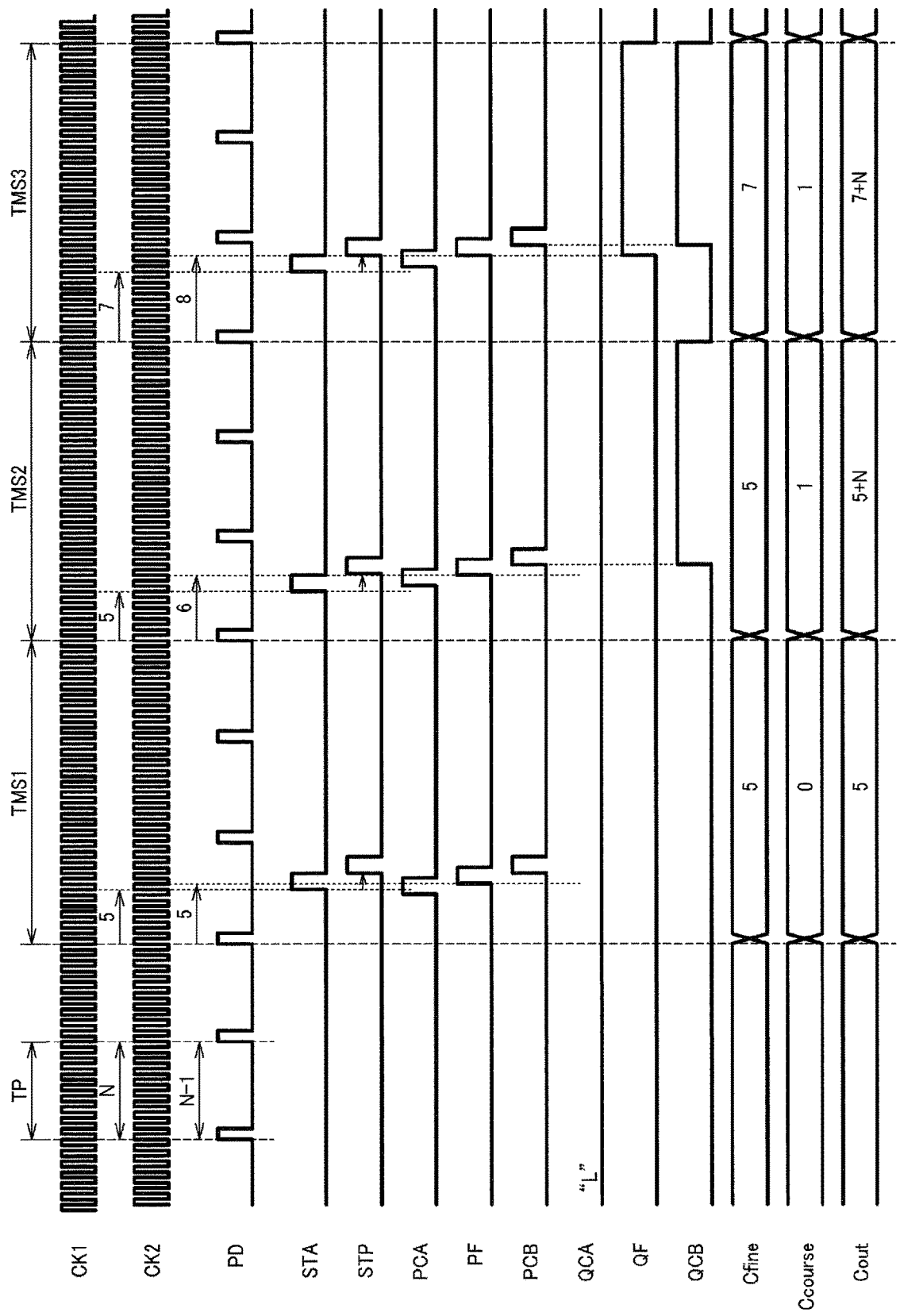
FIG. 4 is a diagram showing a second waveform example for explaining the operation of the circuit device.

FIG. 4 shows a second waveform example for explaining the operation of the circuit device 100. In FIG. 4, there is described a method of obtaining a true value of the digital value Cout representing the time difference between the first signal STA and the second signal STP by the circuit device 100 updating the clock counts Cfine, Ccoarse.

A signal PD shown in FIG. 4 is an internal signal in the signal generation circuit 20, and a signal representing the synchronizing timing of the clock signal CK1 and the clock signal CK2. The period between the edges of the signal PD is defined as TP. In the period TP, the clock count of the clock signal CK1 is N, and the clock count of the clock signal CK2 is N−1. The circuit device 100 performs a measuring operation in the measurement period of the length m×TP. The character m represents an integer no smaller than 2, and FIG. 4 illustrates an example with m=3. The integer m relates to a dynamic range in the time measurement, and the dynamic range is expressed as m×N×Δt.

In FIG. 4, there is shown an example in which the true value of the digital value Cout representing the time difference between the first signal STA and the second signal STP is 7+N×1, namely an example in which Cfine=7 and Ccoarse=1 are true values. In the example shown in FIG. 4, the circuit device 100 updates the values Cfine, Ccoarse in the measurement periods TMS1, TMS2, and thus, the digital value Cout reaches the true value in the measurement period TMS3.

In the measurement period TMS1, Cfine=5 and Ccoarse=0 are assumed. In this case, the signal generation circuit 20 makes the transition of the first signal STA at the transition timing of the fifth clock of the clock signal CK1 from the edge of the signal PD. Further, the signal generation circuit 20 makes the transition of the judging signals PCA, PF, and PCB at the transition timings of the fourth, fifth, and sixth clocks of the clock signal CK2, respectively, from the edge of the signal PD. The second signal STP makes the transition at a timing posterior to the transition timing of the judging signal PCB. Therefore, the phase comparison signals turn to QCA=QF=QCB=L. The character L means the low level.

The processing circuit 40 changes the clock count Ccoarse when the phase comparison signal QCA and the phase comparison signal QCB are the same in signal level. Specifically, the processing circuit 40 sets Ccoarse+1 as a new value of the clock count Ccoarse when QCA=QCB=L is true, or sets Ccoarse−1 as a new value of the clock count Ccoarse when QCA=QCB=H is true. It should be noted that the increment or the decrement of the clock count Ccoarse is not limited to 1. In FIG. 4, since QCA=QCB=L is true, the clock count Ccoarse increases by 1. The signal generation circuit 20 changes the transition timings of the judging signals PCA, PF, and PCB based on the clock count Ccoarse thus updated.

In the measurement period TMS2, Cfine=5 and Ccoarse=1 are assumed. In this case, the signal generation circuit 20 makes the transition of the first signal STA at the transition timing of the fifth clock of the clock signal CK1 from the edge of the signal PD. Further, the signal generation circuit 20 makes the transition of the judging signals PCA, PF, and PCB at the transition timings of the fifth, sixth, and seventh clocks of the clock signal CK2, respectively, from the edge of the signal PD. The second signal STP makes the transition at a timing between the transition timing of the judging signal PF and the transition timing of the judging signal PCB. Therefore, the phase comparison signals turn to QCA=QF=L and QCB=H. The character H means the high level.

The processing circuit 40 changes the clock count fine based on the phase comparison signal QF when the phase comparison signal QCA and the phase comparison signal QCB are different in signal level from each other. Specifically, the processing circuit 40 sets Cfine+2 as a new value of the clock count Cfine when QCA=L, QCB=H are true and QF=L is true, or sets Cfine−2 as a new value of the clock count Cfine when QCA=L, QCB=H are true and QF=H is true. It should be noted that the increment or the decrement of the clock count Cfine is not limited to 2, but can be, for example, 1. In FIG. 4, since QF=L is true, the clock count Cfine increases by 2. The signal generation circuit 20 changes the transition timing of the first signal STA based on the clock count Cfine thus updated.

In the measurement period TMS3, Cfine=7 and Ccoarse=1 are assumed. In this case, the signal generation circuit 20 makes the transition of the first signal STA at the transition timing of the seventh clock of the clock signal CK1 from the edge of the signal PD. Further, the signal generation circuit 20 makes the transition of the judging signals PCA, PF, and PCB at the transition timings of the seventh, eighth, and ninth clocks of the clock signal CK2, respectively, from the edge of the signal PD. The second signal STP makes the transition at the transition timing of the judging signal PF. Therefore, the phase comparison signals turn to QCA=L and QF=QCB=H.

The processing circuit 40 outputs the digital value Cout expressed as Cout=Cfine+N×Ccoarse. In the measurement period TMS3, Cout=7+N×1 is assumed, and the time difference in transition timing between the first signal STA and the second signal STP is converted into the digital value.

It should be noted that in FIG. 4, the first signal STA, the second signal STP, and the judging signals PCA, PF, and PCB each have a pulse waveform, but the signal waveforms are not limited thereto. Specifically, it is also possible for each of the signals to be kept in the high level until the measurement period ends after the transition from the low level to the high level, and then reset to the low level at the beginning of the measurement period.

Figure 5:
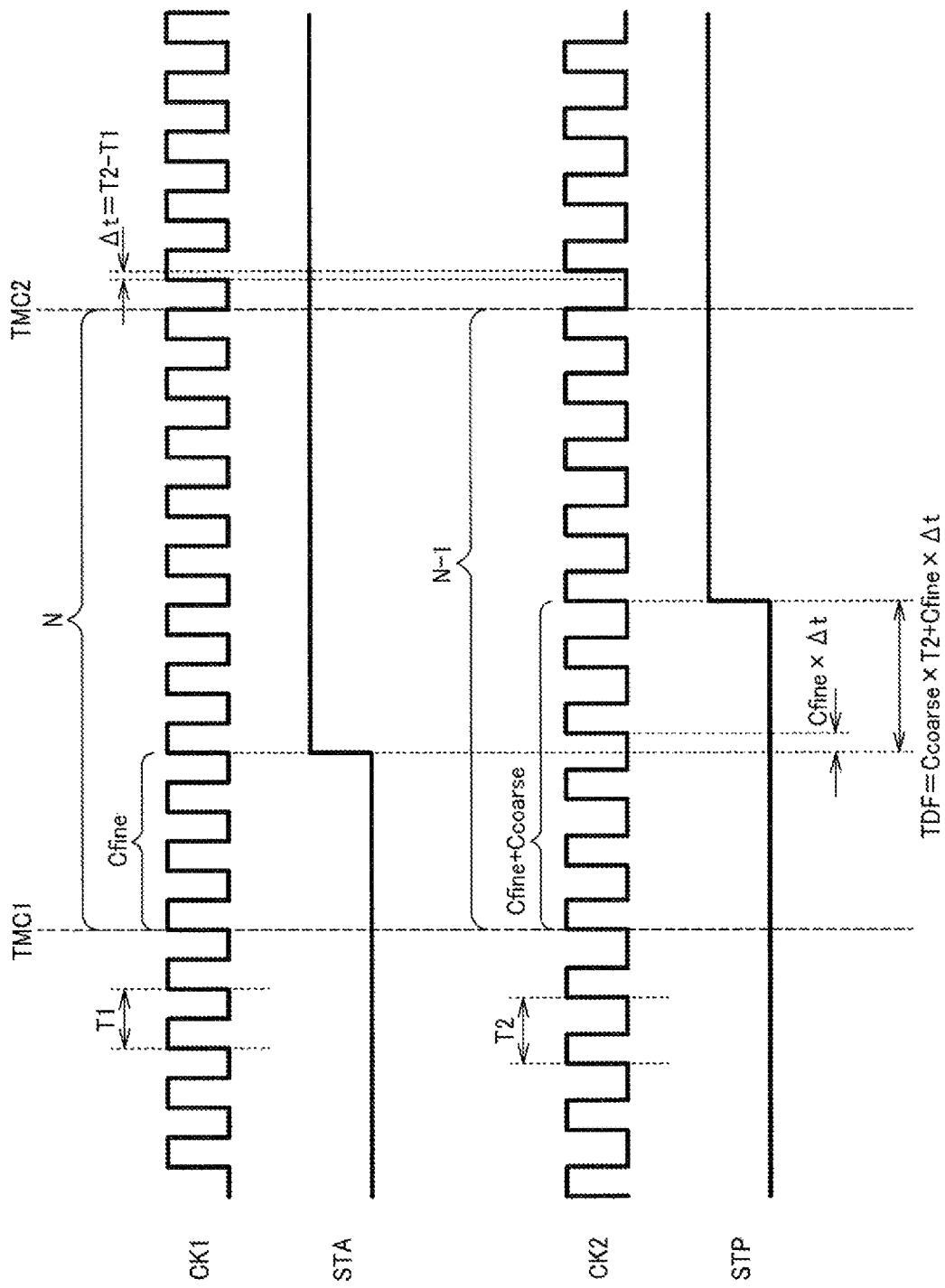
FIG. 5 is a diagram for explaining a calculating formula of a digital value.

FIG. 5 is a diagram for explaining a calculating formula of the digital value Cout. The period of the clock signal CK1 is defined as T1, and the period of the clock signal CK2 is defined as T2. Between the synchronizing timings TMC1, TMC2, the clock count of the clock signal CK1 is N, and the clock count of the clock signal CK2 is N−1. Therefore, the following formula (1) is established. The period difference Δt between the clock signals CK1, CK2 is obtained as the following formula (2) from the formula (1).

$$N \times T1 = (N-1) \times T2 \quad (1)$$

$$\Delta t = T2 - T1 = T2/N \quad (2)$$

It is assumed that the second signal STP makes the transition at the (Cfine+Ccoarse)-th edge of the clock signal CK2 from the synchronizing timing TMC1. Since the first signal STA makes the transition at the Cfine-th edge of the clock signal CK1 from the synchronizing timing TMC1, the period from the transition timing of the first signal STA to the edge of the first clock signal CK2 after the transition timing of the first signal STA is Cfine×Δt. The period from the edge of the clock signal CK2 to the transition timing of the second signal STP is Ccoarse×T2. Therefore, using the formula (2) described above, the time difference TDF between the first signal STA and the second signal STP is obtained as the following formula (3). Since the relationship between the time difference TDF and the digital value Cout is expressed as the following formula (4), the digital value Cout is expressed as the following formula (5) from the following formulas (3), (4).

$$\begin{aligned} TDF &= Ccoarse \times T2 + Cfine \times \Delta t \\ &= (Ccoarse \times N + Cfine) \times \Delta t \end{aligned} \quad (3)$$

$$TDF = Cout \times \Delta t \quad (4)$$

$$Cout = TDF/\Delta t = Ccoarse \times N + Cfine \quad (5)$$

According to the present embodiment described hereinabove, by the signal generation circuit 20 generating the judging signals PCA, PCB, and then the phase comparison circuit 30 comparing the transition timings of the second signal STP and the judging signals PCA, PCB with each other, it is possible for the processing circuit 40 to update the clock count Ccoarse based on the comparison result. Thus, it is possible to reduce the measurement period compared to the method described with reference to FIG. 1.

Specifically, the update of the clock count Ccoarse is hereinafter referred to as a coarse judgment, and the update of the clock count Cfine is hereinafter referred to as a fine judgment. In the waveform chart shown in FIG. 4, the measurement period TMS1 corresponds to the coarse judgment, and the measurement period TMS2 corresponds to the fine judgment. In the coarse judgment, when the clock count Ccoarse changes as much as 1, the digital value Cout changes as much as N×Δt. Therefore, the digital value Cout comes closer to the true value at higher speed compared to the fine judgment in which the digital value Cout is changed by 1×Δt. For example, in FIG. 4, since the length of one measurement period is 3×TP, the digital value Cout changes as much as N×Δt in every 3×TP in the coarse judgment. In FIG. 1, since the digital value changes by 1×Δt in one measurement period TP, it takes N×TP to change the digital value as much as N×Δt. In other words, the digital value Cout comes approaches the true value N/3 times faster in the coarse judgment in the present embodiment as a result.

As described above, in the present embodiment, by providing the judging signals PCA, PCB, the coarse judgment becomes possible, and due to the coarse judgment, the measurement period is shortened. Thus, it becomes possible to achieve an increase in dynamic range or an increase in resolution while suppressing an increase in the measurement period.

2. First Detailed Configuration Example

Figure 6:
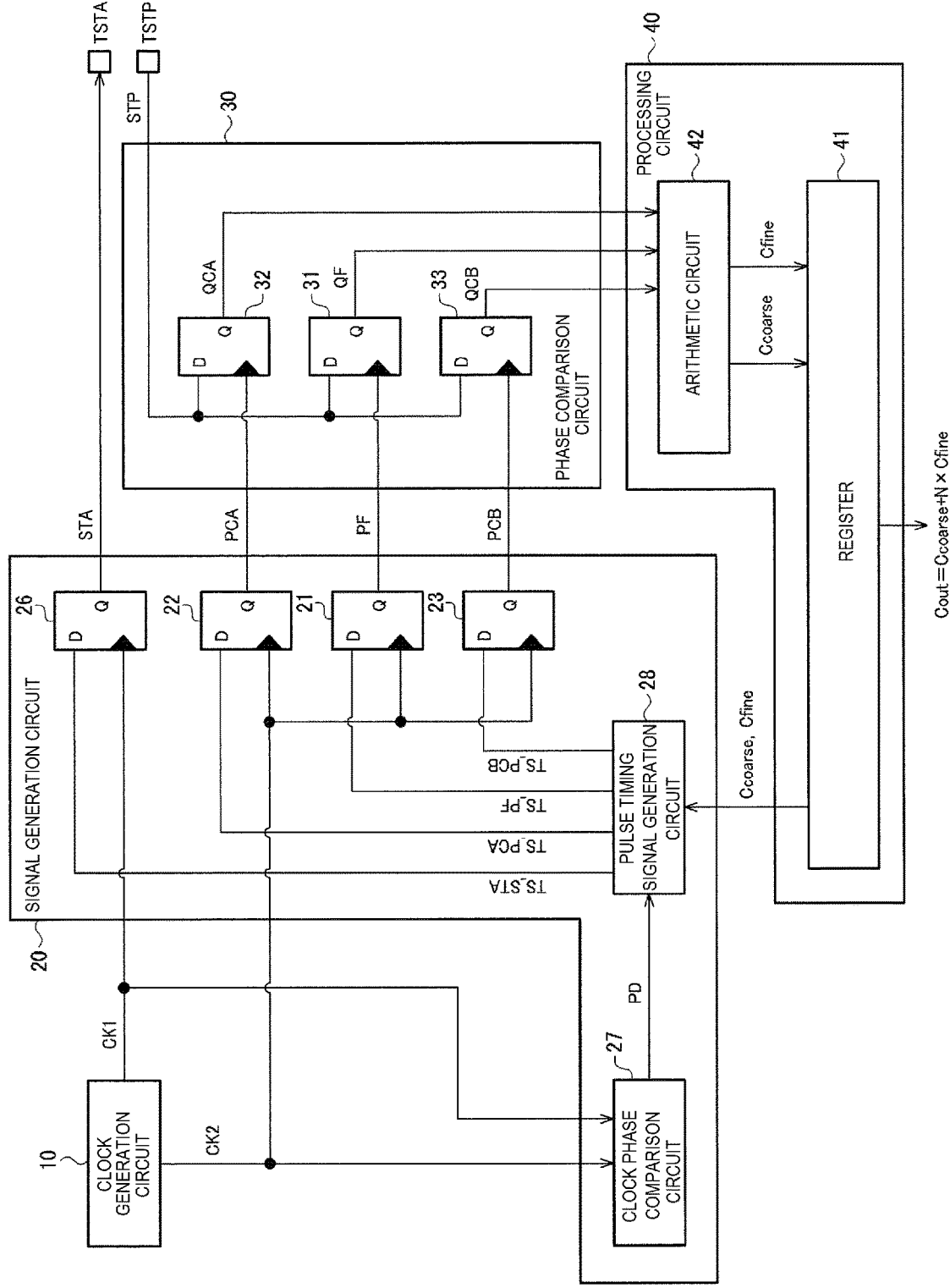
FIG. 6 is a diagram showing a first detailed configuration example of a signal generation circuit, a phase comparison circuit, and a processing circuit.

FIG. 6 shows a first detailed configuration example of the signal generation circuit 20, the phase comparison circuit 30, and the processing circuit 40.

The signal generation circuit 20 includes latch circuits 21 through 23, and 26 as comparison circuits, a clock phase comparison circuit 27, and a pulse timing signal generation circuit 28.

The clock phase comparison circuit 27 compares the phases of the clock signal CK1 and the clock signal CK2 to each other to thereby detect the synchronizing timing, and then outputs the detection result as the signal PD. The clock phase comparison circuit 27 makes the transition of the signal PD when the transition timings of the clock signal CK1 and the clock signal CK2 are transposed.

The pulse timing signal generation circuit 28 generates timing signals TS_STA, TS_PCA, TS_PF, and TS_PCB based on the signal PD, and the clock counts Cfine, Ccoarse. Specifically, the pulse timing signal generation circuit 28 makes the transition of the timing signal TS_STA at the Cfine-th transition timing of the clock signal CK1 from the transition timing of the signal PD. Further, the pulse timing signal generation circuit 28 makes the transitions of the timing signals TS_PCA, TS_PF, and TS_PCB at the (Cfine+Ccoarse−1)-th transition timing, the (Cfine+Ccoarse)-th transition timing, and the (Cfine+Ccoarse+1)-th transition timing of the clock signal CK2, respectively, from the transition timing of the signal PD.

The latch circuit 26 latches the timing signal TS_STA with the clock signal CK1, and then outputs the signal thus latched as the first signal STA. The latch circuits 21, 22, and 23 latch the timing signals TS_PCA, TS_PF, and TS_PCB with the clock signal CK2, respectively, and then output the signals thus latched as the judging signals PCA, PF, and PCB.

The phase comparison circuit 30 includes a latch circuit 31 as a first phase comparison circuit, a latch circuit 32 as a second phase comparison circuit, and a latch circuit 33 as a third phase comparison circuit.

The latch circuit 31 performs the phase comparison between the judging signal PF and the second signal STP. Specifically, the latch circuit 31 latches the judging signal PF at the transition timing of the second signal STP, and then outputs the signal thus latched as the phase comparison signal QF. Similarly, the latch circuits 32, 33 perform the phase comparison between the judging signals PCA, PCB and the second signal STP, respectively. Specifically, the latch circuits 32, 33 latch the judging signals PCA, PCB at the transition timing of the second signal STP, and then outputs the signals thus latched as the phase comparison signals QCA, QCB, respectively.

The processing circuit 40 includes an arithmetic circuit 42 and the register 41.

The arithmetic circuit 42 obtains the clock counts Cfine, Ccoarse to be used in the next measurement period based on the judging signals PF, PCA, and PCB. Specifically, the arithmetic circuit 42 adds a change step x to the clock count Ccoarse when PCA=PCB=L is true, and subtracts the change step x from the clock count Ccoarse when PCA=PCB=H is true. The change step x is an integer equal to or greater than 1. Further, the arithmetic circuit 42 adds a change step y to the clock count Cfine when PCA=L and PCB=H are true, and PF=L is true, and subtracts the change step y from the clock count Cfine when PCA=L and PCB=H are true, and PF=H is true. The change step y is an integer equal to or greater than 1.

The processing circuit 40 makes the register 41 store the clock counts Cfine, Ccoarse obtained by the arithmetic circuit 42. The processing circuit 40 obtains the digital value Cout from the clock counts Cfine, Ccoarse obtained by the arithmetic circuit 42, and then makes the register 41 store the digital value Cout. The processing circuit 40 outputs the clock counts Cfine, Ccoarse stored in the register 41 to the pulse timing signal generation circuit 28, and then outputs the digital value Cout stored in the register 41 as a time measurement result.

Figure 7:
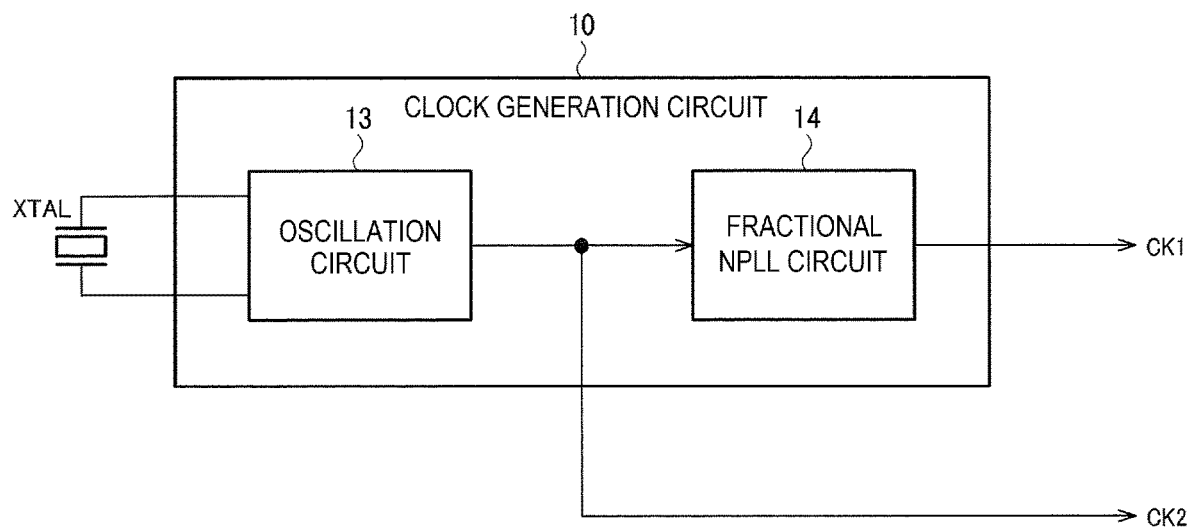
FIG. 7 is a diagram showing a first detailed configuration example of a clock generation circuit.

FIG. 7 shows a first detailed configuration example of the clock generation circuit 10. The clock generation circuit 10 includes an oscillation circuit 13 and a fractional NPLL circuit 14.

The oscillation circuit 13 is electrically coupled to a resonator XTAL. Specifically, the circuit device 100 includes a first coupling terminal and a second coupling terminal, and an end of the resonator XTAL and the oscillation circuit 13 are coupled to each other via the first coupling terminal, and the other end of the resonator XTAL and the oscillation circuit 13 are coupled to each other via the second coupling terminal. The oscillation circuit 13 oscillates the resonator XTAL to thereby generate the clock signal CK2. As the oscillation circuit 13, there can be used a variety of types of oscillation circuit such as a Pierce type, a Colpitts type, an inverter type, and a Hartley type. It should be noted that the coupling in the present embodiment is electrical coupling. The electrical coupling means coupling capable of transmitting an electrical signal, and is coupling with which transmission of information by the electrical signal is achievable. The electrical coupling can also be coupling via a passive element, an active element, or the like.

The resonator XTAL is an element for generating a mechanical vibration due to an electrical signal. The resonator XTAL can be realized by a resonator element such as a quartz crystal resonator element. For example, the resonator XTAL can be realized by a quartz crystal resonator element vibrating in a thickness-shear mode having the cutting angle such as AT-cut or SC-cut, and so on. It should be noted that the resonator XTAL can be realized by a variety of resonator elements such as a resonator element other than the thickness-shear vibration type or a piezoelectric resonator element formed of a material other than the quartz crystal. For example, as the resonator XTAL, it is also possible to adopt a surface acoustic wave (SAW) resonator, an MEMS (micro electro-mechanical systems) resonator as a silicon resonator formed using a silicon substrate, and so on.

The fractional NPLL circuit 14 generates the clock signal CK1 based on the clock signal CK2. Specifically, the fractional NPLL circuit 14 generates the clock signal CK1 by multiplying the frequency of the clock signal CK2 by N/(N−1). For example, the fractional NPLL circuit 14 includes a phase comparison circuit, a loop filter, a voltage-controlled oscillation circuit, and a frequency divider circuit. The phase comparison circuit performs the phase comparison between a frequency division clock signal output by the frequency divider circuit and the clock signal CK2. The loop filter performs low-pass filter processing on the output signal of the phase comparison circuit to thereby output a control voltage. The voltage-controlled oscillation circuit oscillates with the oscillation frequency corresponding to the control voltage, and outputs the clock signal CK1 based on the oscillation signal. The frequency divider circuit divides the frequency of the clock signal CK1 at a first frequency division ratio or a second frequency division ratio. The first frequency division ratio and the second frequency division ratio are integers different from each other, and by the frequency divider circuit selecting the first and second frequency division ratios in a time series manner, there is realized a fractional frequency division ratio as a temporal average.

Figure 8:
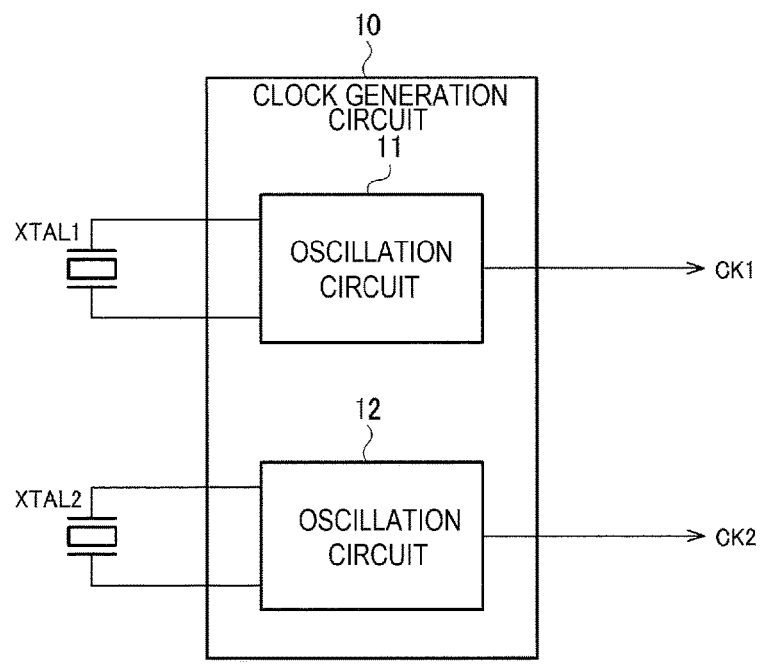
FIG. 8 is a diagram showing a second detailed configuration example of the clock generation circuit.

FIG. 8 shows a second detailed configuration example of the clock generation circuit 10. The clock generation circuit 10 includes an oscillation circuit 11 as a first oscillation circuit, and an oscillation circuit 12 as a second oscillation circuit.

The oscillation circuit 11 is electrically coupled to a resonator XTAL1 as a first resonator. The oscillation circuit 12 is electrically coupled to a resonator XTAL2 as a second resonator. Specifically, the circuit device 100 includes first through fourth coupling terminals, one end of the resonator XTAL1 and the oscillation circuit 11 are coupled to each other via the first coupling terminal, the other end of the resonator XTAL1 and the oscillation circuit 11 are coupled to each other via the second coupling terminal, one end of the resonator XTAL2 and the oscillation circuit 12 are coupled to each other via the third coupling terminal, and the other end of the resonator XTAL2 and the oscillation circuit 12 are coupled to each other via the fourth coupling terminal. The oscillation circuit 11 oscillates the resonator XTAL1 to thereby generate the clock signal CK1. The oscillation circuit 12 oscillates the resonator XTAL2 to thereby generate the clock signal CK2. The frequency of the clock signal CK2 is (N−1)/N time as high as the frequency of the clock signal CK1. As the oscillation circuits 11, 12, there can be used a variety of types of oscillation circuit such as a Pierce type, a Colpitts type, an inverter type, and a Hartley type.

3. Second Configuration Example

Figure 9:
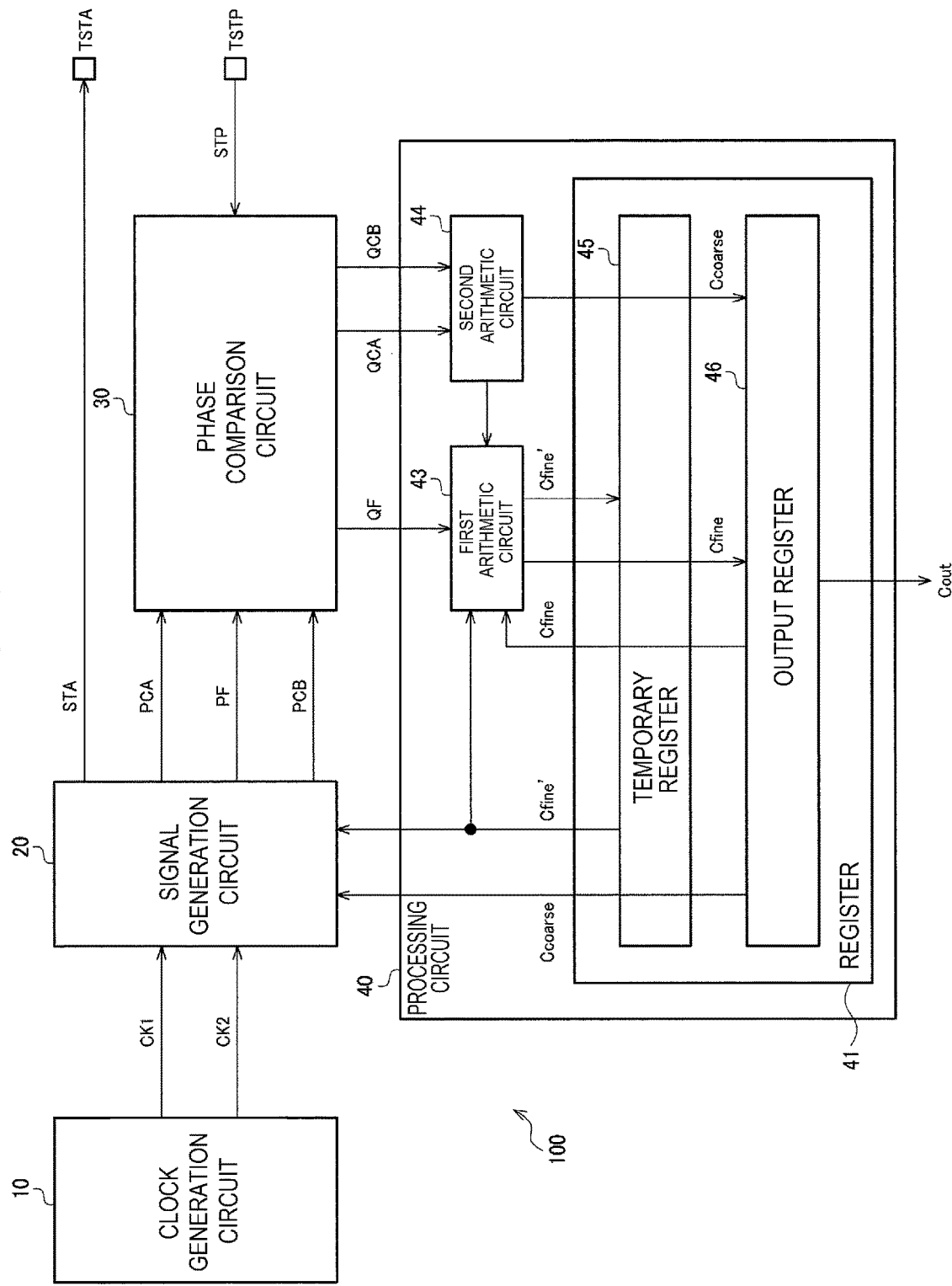
FIG. 9 is a diagram showing a second configuration example of the circuit device and a second detailed configuration example of the processing circuit.

FIG. 9 shows a second configuration example of the circuit device 100 and a second detailed configuration example of the processing circuit 40. The circuit device 100 includes the clock generation circuit 10, the signal generation circuit 20, the phase comparison circuit 30, the processing circuit 40, the terminals TSTA, TSTP.

In the present embodiment, the processing circuit 40 adds a dither value to the clock count Cfine to thereby update the clock count Cfine. The dither value is a value randomly selected from integers no smaller than 1 and no greater than k. The character k denotes an integer no smaller than 2.

Figure 11:
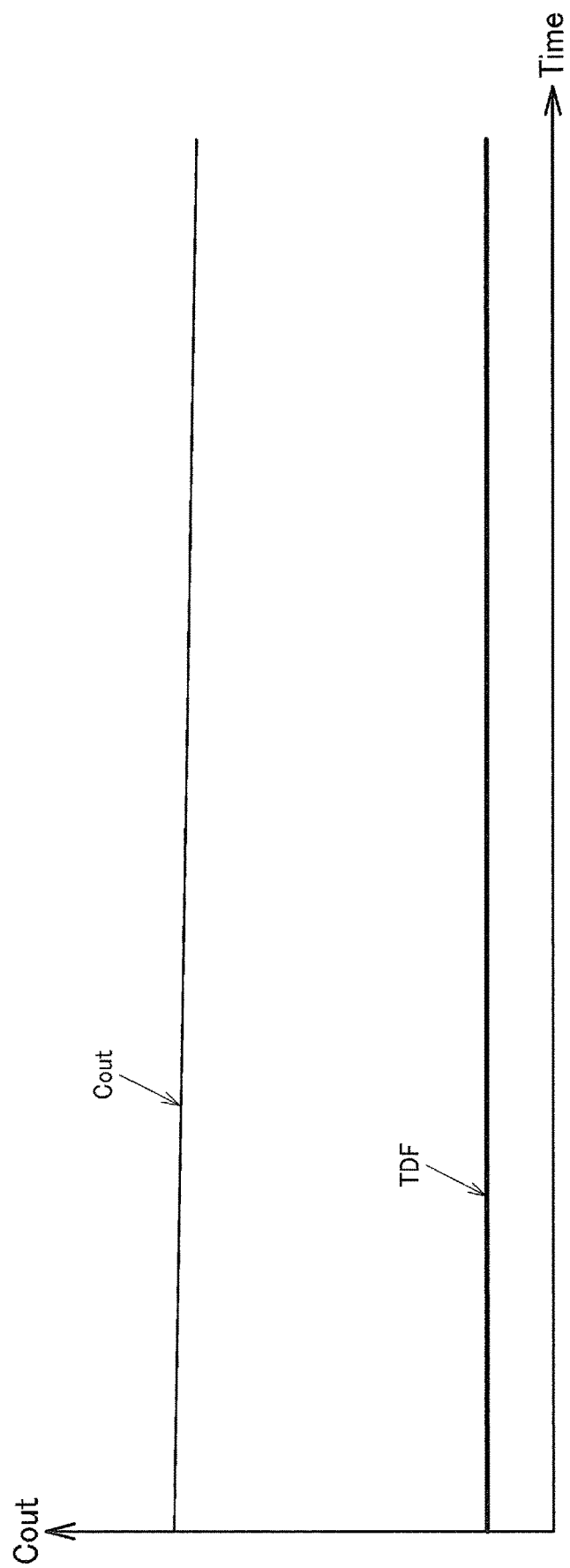
FIG. 11 is a diagram showing a waveform example when Cfine is updated by −1.

In this way, since the clock count Cfine is updated with the dither value, the measurement time is shortened compared to when being updated by 1. Specifically, as shown in FIG. 11, when the clock count Cfine is updated by −1 in the fine judgment, the measurement time until the digital value Cout reaches the true time difference TDF becomes long. In contrast, as shown in FIG. 12 and FIG. 13, when the clock count Cfine is updated with the dither value in the fine judgment, since the clock count Cfine is randomly updated with the integers no smaller than 1 and no greater than k, the measurement time until the digital value Cout reaches the true time difference TDF is shortened.

Figure 12:
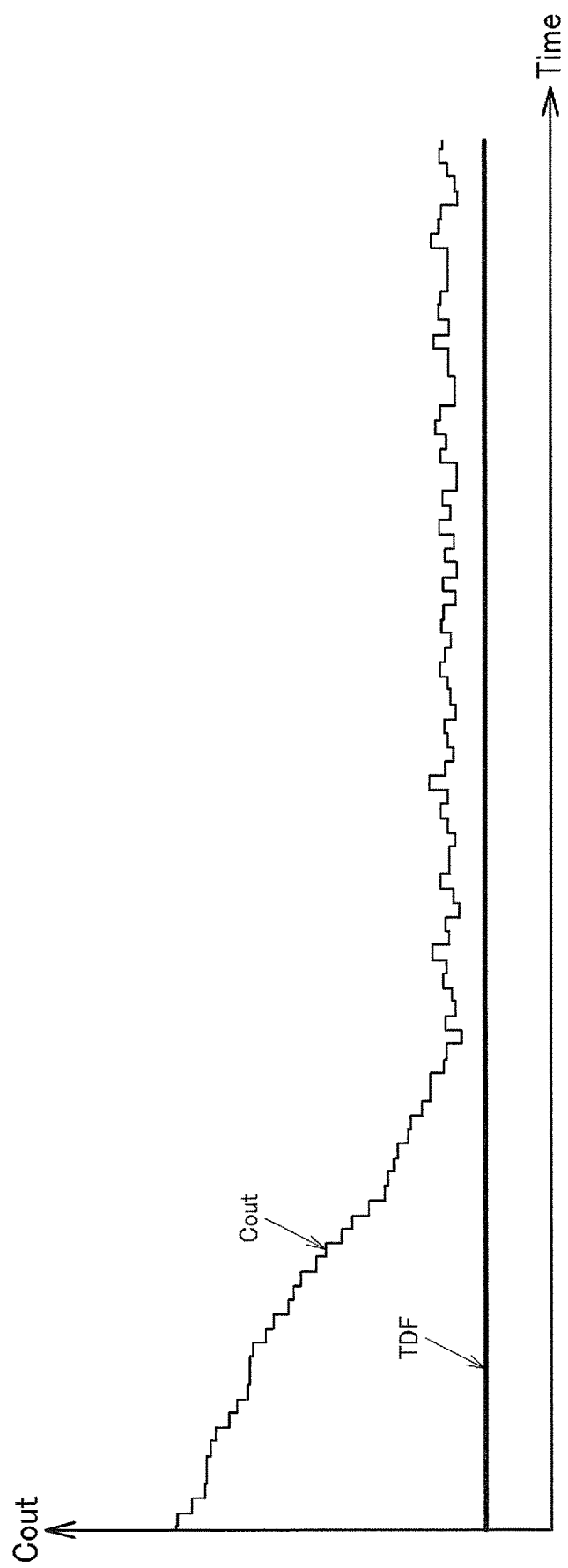
FIG. 12 is a diagram showing a waveform example when Cfine is updated with dither values.
Figure 13:
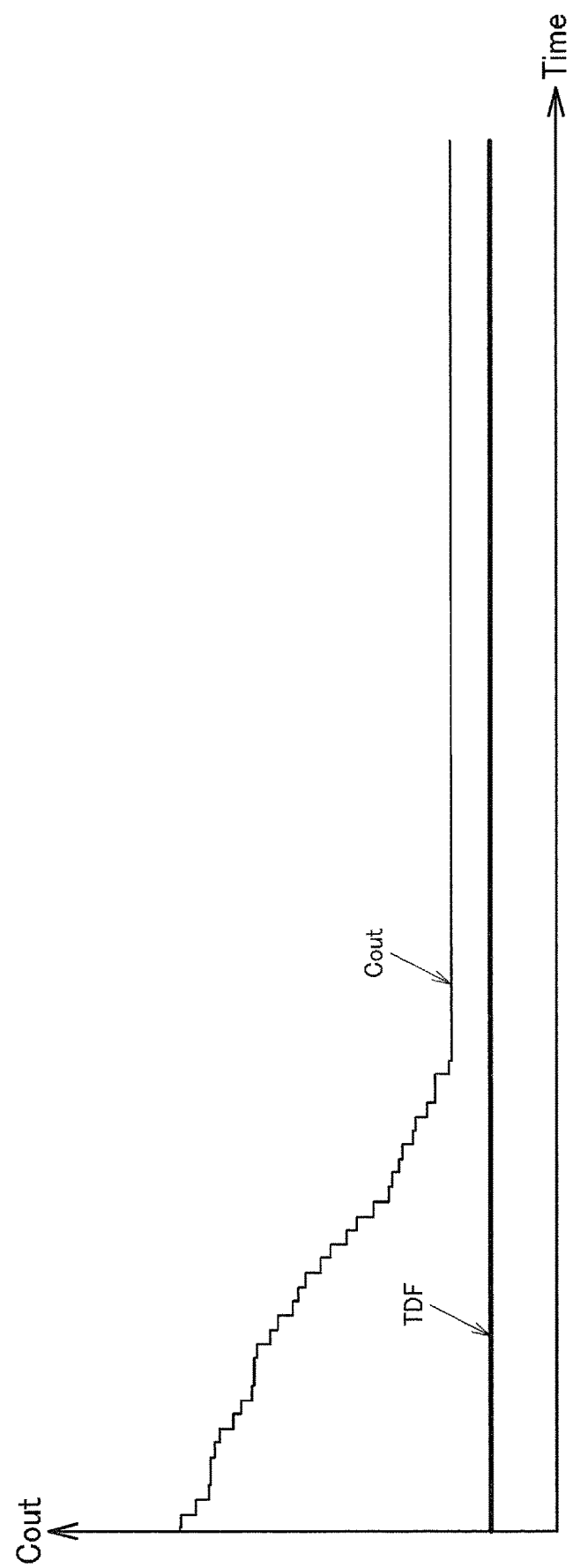
FIG. 13 is a diagram showing a waveform example when Cfine is updated with dither values.

The waveform shown in FIG. 13 is reduced in noise of the digital value Cout compared to the waveform shown in FIG. 12. A configuration example for realizing speeding-up and noise reduction of the digital value Cout due to the dither addition as shown in FIG. 13 will hereinafter be described.

As shown in FIG. 9, the processing circuit 40 includes a first arithmetic circuit 43, a second arithmetic circuit 44, and the register 41. The register 41 includes a temporary register 45 and an output register 46.

The second arithmetic circuit 44 obtains the clock count Ccoarse based on the phase comparison signals QCA, QCB, and then makes the output register 46 store the clock count Ccoarse. The method of the second arithmetic circuit 44 updating the clock count Ccoarse is substantially the same as the method of the arithmetic circuit 42 shown in FIG. 6 updating the clock count Ccoarse. When the phase comparison signals QCA, QCB are different in signal level from each other, the second arithmetic circuit 44 gives notice of this fact to the first arithmetic circuit 43.

When the first arithmetic circuit 43 has received the notice from the second arithmetic circuit 44, the first arithmetic circuit 43 makes the temporary register 45 store the clock count Cfine' which has been updated based on the phase comparison signal QF. The first arithmetic circuit 43 updates the clock count Cfine' with the dither value.

The signal generation circuit 20 outputs the first signal STA and the judging signal PCA, PF, and PCB based on the clock count Cfine' stored in the temporary register 45 and the clock count Ccoarse stored in the output register 46. The operation of the signal generation circuit 20 is substantially the same as the operation of the signal generation circuit 20 described with reference to FIG. 6 and so on.

Figure 10:
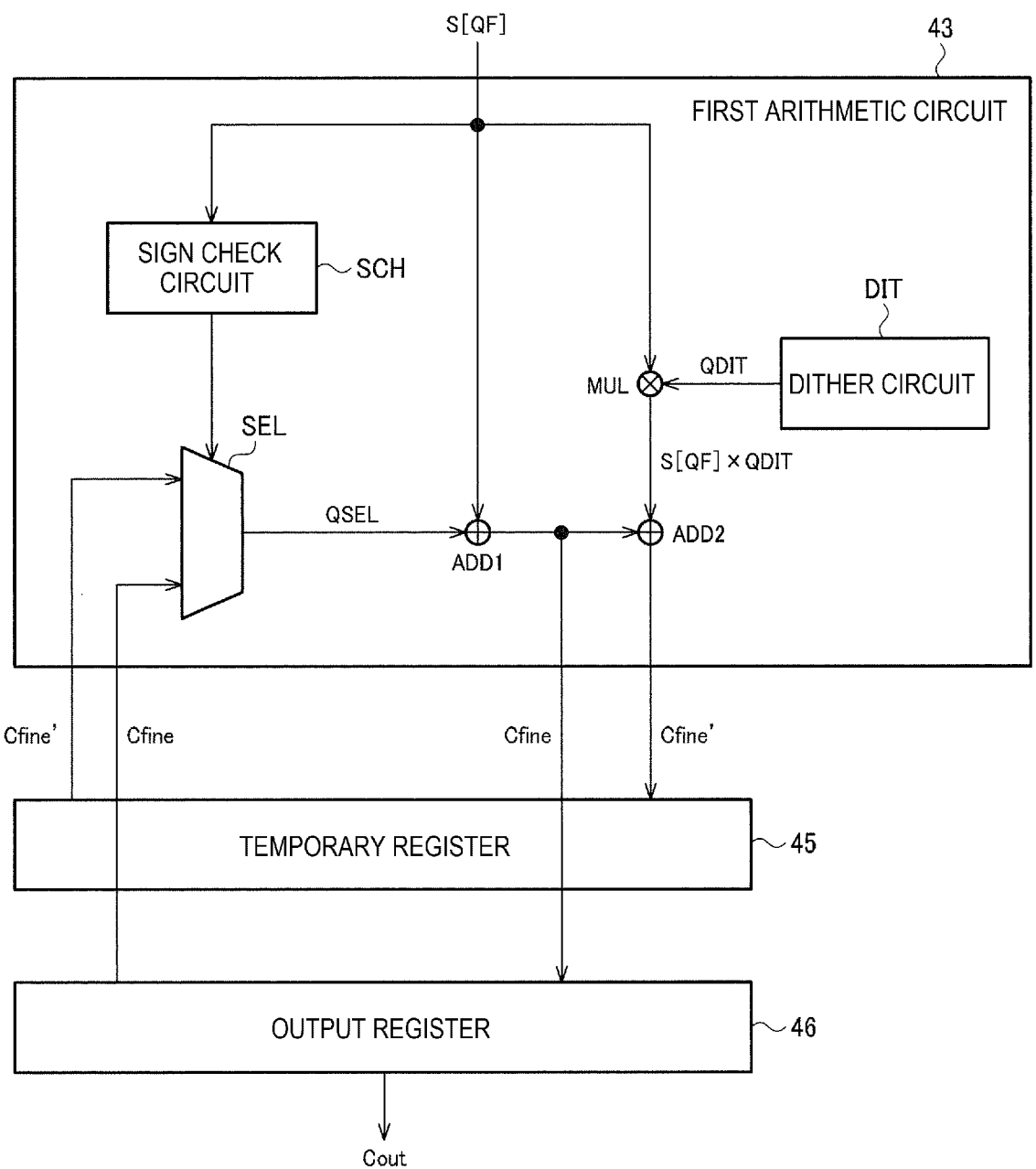
FIG. 10 is a diagram showing a detailed configuration example of a first arithmetic circuit.

In such a manner as described above, by the first arithmetic circuit 43 updating the clock count Cfine' with the dither value, the fine judgment is speeded up. Separately from the clock count Cfine', the first arithmetic circuit 43 makes the output register 46 store the clock count Cfine. The processing circuit 40 obtains the digital value Cout from the clock counts Cfine, Ccoarse stored in the output register 46. Although the clock count Cfine is basically updated with the dither value, but is updated by 1 when the digital value Cout is close to the true value. Thus, the noise of the digital value Cout is reduced. FIG. 10 shows a detailed configuration example of the first arithmetic circuit 43 which realizes this operation.

The first arithmetic circuit 43 includes a dither circuit DIT, a sign check circuit SCH, a selector SEL, adders ADD1, ADD2, and a multiplier MUL. In FIG. 10, it is assumed that S[QF]=+1 is true when the phase comparison signal QF is in the low level, and it is assumed that S[QF]=−1 is true when the phase comparison signal QF is in the high level. In other words, S[QF] corresponds to a positive or negative sign.

The dither circuit DIT outputs the dither value QDIT. The multiplier MUL multiplies the dither value QDIT by the sign. In other words, the multiplier MUL calculates S[QF]× QDIT. The adder ADD2 adds the clock count Cfine output by the adder ADD1 and S[QF]×QDIT output by the multiplier MUL to each other to output the result to the temporary register 45 as the clock count Cfine'. As described above, the clock count Cfine' is updated with the dither value QDIT.

The sign check circuit SCH stores the sign S[QF] in the previous measurement period in advance, compares the sign S[QF] in the previous measurement period and the sign S[QF] in the current measurement period with each other, and then outputs the result to the selector SEL. The sign S[QF] changes when the transition timings of the second signal STP and the judging signal PF are transposed. This means that the transition timings of the second signal STP and the judging signal PF are close to each other, and therefore, corresponds to the fact that the clock count Cfine is nearly the true value. In contrast, the sign S [QF] does not change when the clock count Cfine is far from the true value.

The selector SEL selects the clock count Cfine' stored in the temporary register 45 when the comparison result of the sign is the "same sign," or selects the clock count Cfine stored in the output register 46 when the comparison result of the sign is the "opposite sign." The adder ADD1 adds the clock count QSEL output by the selector SEL and the phase comparison signal QF to each other, and then outputs the result to the output register 46 as the clock count Cfine.

When the comparison result of the sign is the "same sign," the clock count Cfine is far from the true value. In this case, since the selector SEL selects the clock count Cfine', the clock count Cfine is updated with the dither value QDIT and the sign S [QF]. Thus, the time until the clock count Cfine reaches the true value is shortened. When the comparison result of the sign is the "opposite sign," the clock count Cfine is close to the true value. In this case, since the selector SEL selects the clock count Cfine, the clock count Cfine is updated with the sign S[QF]. As shown in FIG. 13, since the clock count Cfine only changes by ±1 after the clock count Cfine has come close to the true value, the noise due to the dither value QDIT stops occurring.

4. Third Configuration Example

Figure 14:
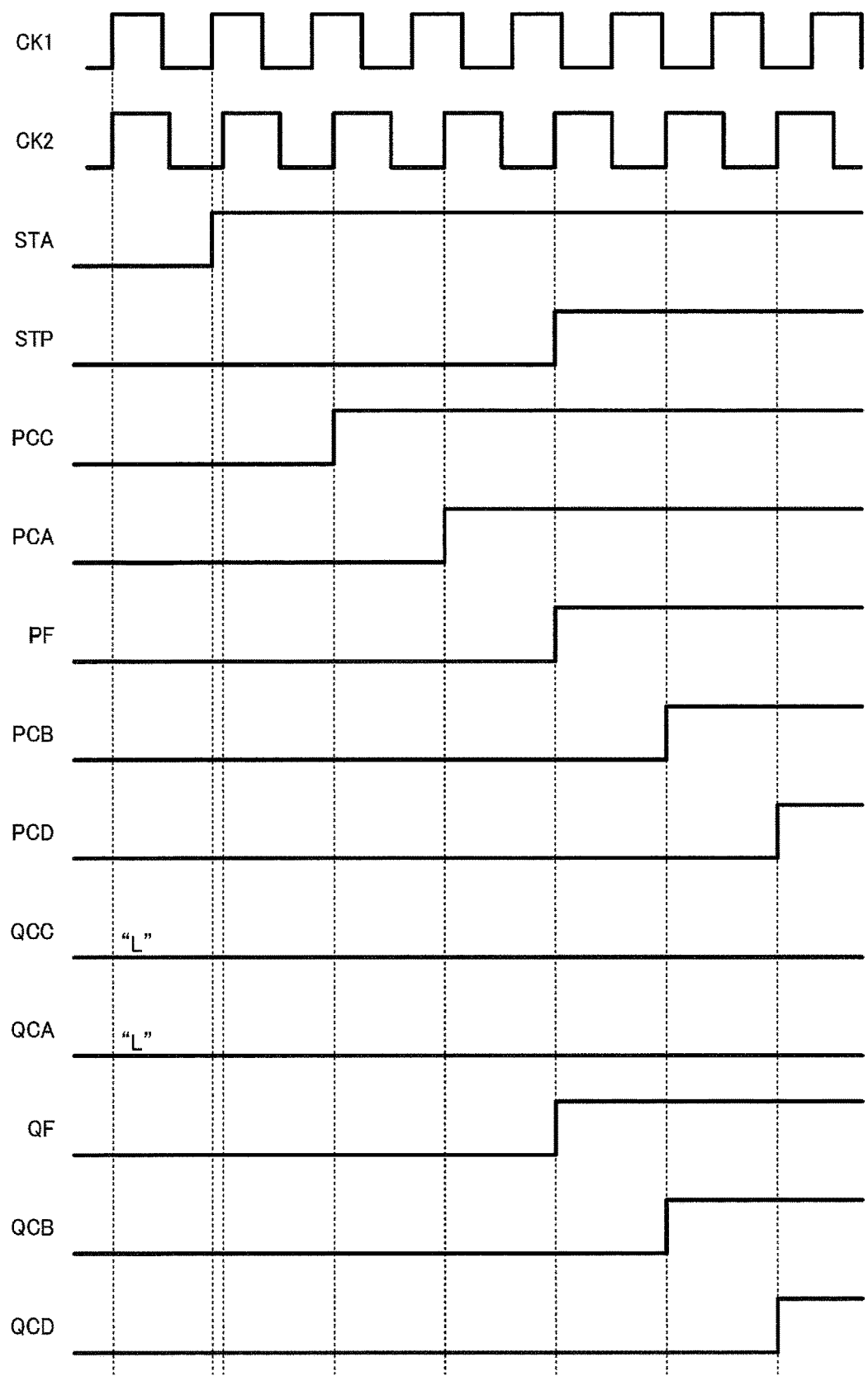
FIG. 14 is a diagram showing a waveform example for explaining an operation of a third configuration example of the circuit device.

FIG. 14 shows a waveform example for explaining an operation of a third configuration example of the circuit device 100. It should be noted that in the third configuration example, the circuit device 100 has substantially the same configuration as that of the first configuration example shown in FIG. 2. It should be noted that the signal generation circuit 20 further generates a judging signal PCC as a third coarse-judging signal, and a judging signal PCD as a fourth coarse-judging signal. Further, the phase comparison circuit 30 further outputs a phase comparison signal QCC as a fourth phase comparison signal, and a phase comparison signal QCD as a fifth phase comparison signal. Hereinafter, parts different from those in the first configuration example will mainly be described.

As shown in FIG. 14, the judging signal PCC makes the transition at the transition timing of the clock signal CK2 anterior to the judging signal PCA. The judging signal PCD makes the transition at the transition timing of the clock signal CK2 posterior to the judging signal PCB. Specifically, the signal generation circuit 20 makes the transition of the judging signal PCC at the transition timing in the clock count Cfine+Ccoarse−2 of the clock signal CK2 from the synchronizing timing TMC, and makes the transition of the judging signal PCD at the transition timing in the clock count Cfine+Ccoarse+2 of the clock signal CK2 from the synchronizing timing TMC.

The phase comparison circuit 30 performs the phase comparison between the second signal STP and the judging signal PCC to thereby output the phase comparison signal QCC, and performs the phase comparison between the second signal STP and the judging signal PCD to thereby output the phase comparison signal QCD. Specifically, the phase comparison circuit 30 makes the transition of the phase comparison signals QCC, QCD at the transition timings of the judging signals PCC, PCD when the second signal STP makes the transition before the transition timings of the judging signals PCC, PCD. In FIG. 14, the phase comparison signals QF, QCB, and QCD make the transition from the low level to the high level at the transition timings of the judging signals PF, PCB, and PCD, respectively. The phase comparison signals QCC, QCA are kept in the low level without making the transition.

In the third configuration example, the processing circuit 40 variably controls the change step of the clock count Ccoarse based on the phase comparison signals QCA through QCD to update the clock count Ccoarse with the change step. Thus, it is possible to further increase the speed at which the digital value Cout comes closer to the true value in the coarse judgment. This point will be described with reference to FIG. 15 and FIG. 16.

Figure 15:
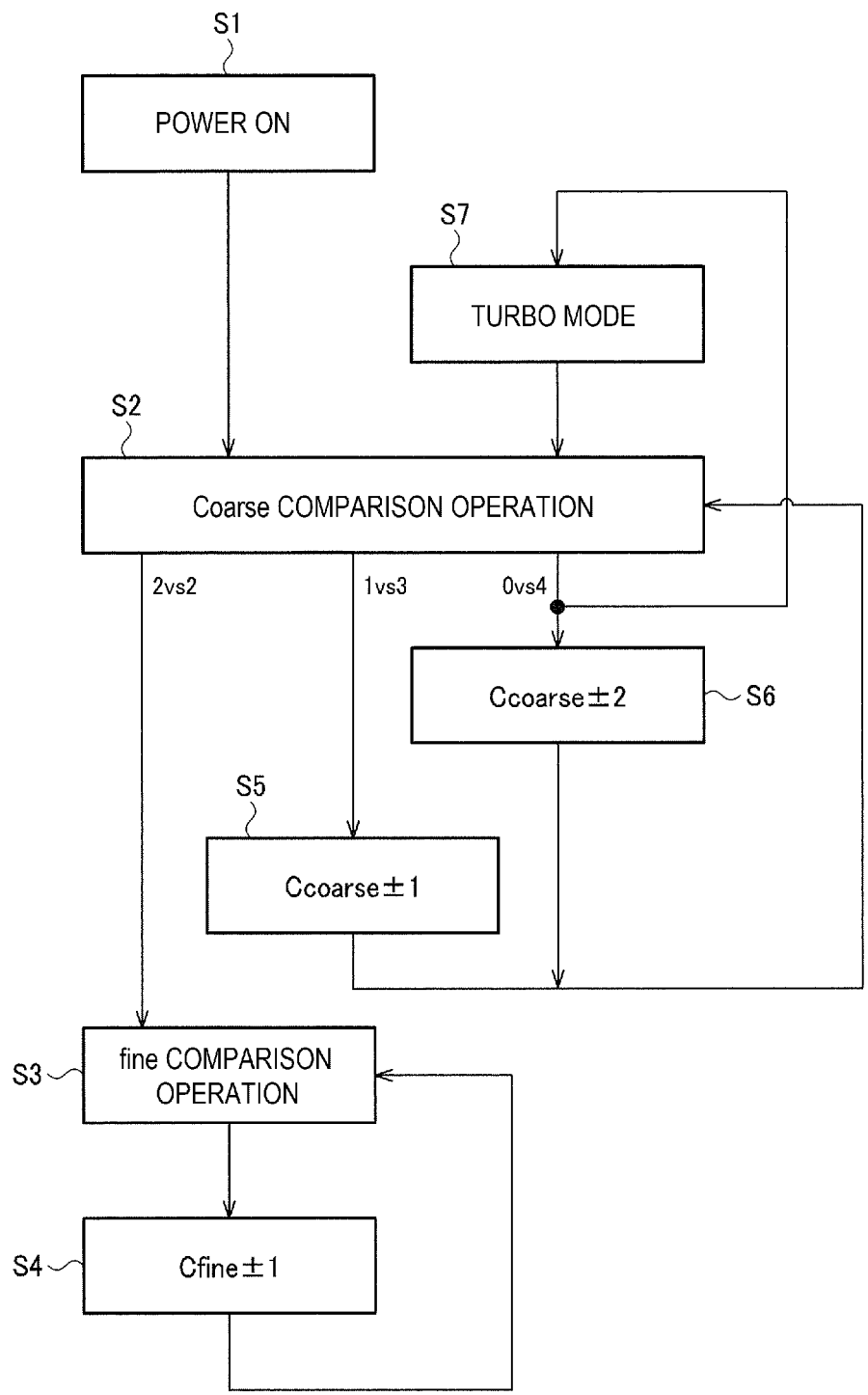
FIG. 15 is a state transition diagram in a normal mode.

FIG. 15 is a state transition diagram in a normal mode. It should be noted that although a turbo mode in a state S7 is described in FIG. 15, the normal mode is an operation mode when the circuit device 100 is in a state S1 through a state S6.

The processing circuit 40 makes the transition from the state S1 to the state S2 when the circuit device 100 is powered ON. In the state S2, the phase comparison circuit 30 compares the transition timing of the second signal STP and the transition timings of the judging signals PCA through PCD with each other. Hereinafter, the comparison result is described in such a manner as LHHH. The comparison result LHHH means the logical levels of the phase comparison signals QCC, QCA, QCB, and QCD from the left.

The character string "2vs2" means that the comparison result is LLHH. In this case, the processing circuit 40 makes the transition to the state S3 to compare the transition timing of the second signal STP and the transition timing of the judging signal PF with each other. The processing circuit 40 makes the transition to the state S4 to update the clock count Cfine. The processing circuit 40 sets Cfine+1 as a new value of the clock count Cfine when QF=L is true, or sets Cfine−1 as a new value of the clock count Cfine when QF=H is true.

In the state S2, the character string "1vs3" means that the comparison result is LLLH or LHHH. In this case, the processing circuit 40 makes the transition to the state S5 to update the clock count Ccoarse. The processing circuit 40 sets Ccoarse+1 as a new value of the clock count Ccoarse when the comparison result is LLLH, or sets Ccoarse−1 as a new value of the clock count Ccoarse when the comparison result is LHHH.

In the state S2, the character string "0vs4" means that the comparison result is LLLL or HHHH. In this case, the processing circuit 40 makes the transition to the state S6 to update the clock count Ccoarse. The processing circuit 40 sets Ccoarse+2 as a new value of the clock count Ccoarse when the comparison result is LLLL, or sets Ccoarse−2 as a new value of the clock count Ccoarse when the comparison result is HHHH.

As described above, the processing circuit 40 variably controls the change step of the clock count Ccoarse to 1 or 2 in accordance with whether the comparison result is "1vs3" or "0vs4." Since the comparison result becomes "0vs4" when the clock count Ccoarse is far from the true value, it is possible to make the clock count Coarse come close to the true value at higher speed by setting the change step to 2.

In the state S2, when the comparison result becomes "0vs4" a predetermined number of times in a row, the processing circuit 40 makes the transition to the turbo mode in the state S7.

Figure 16:
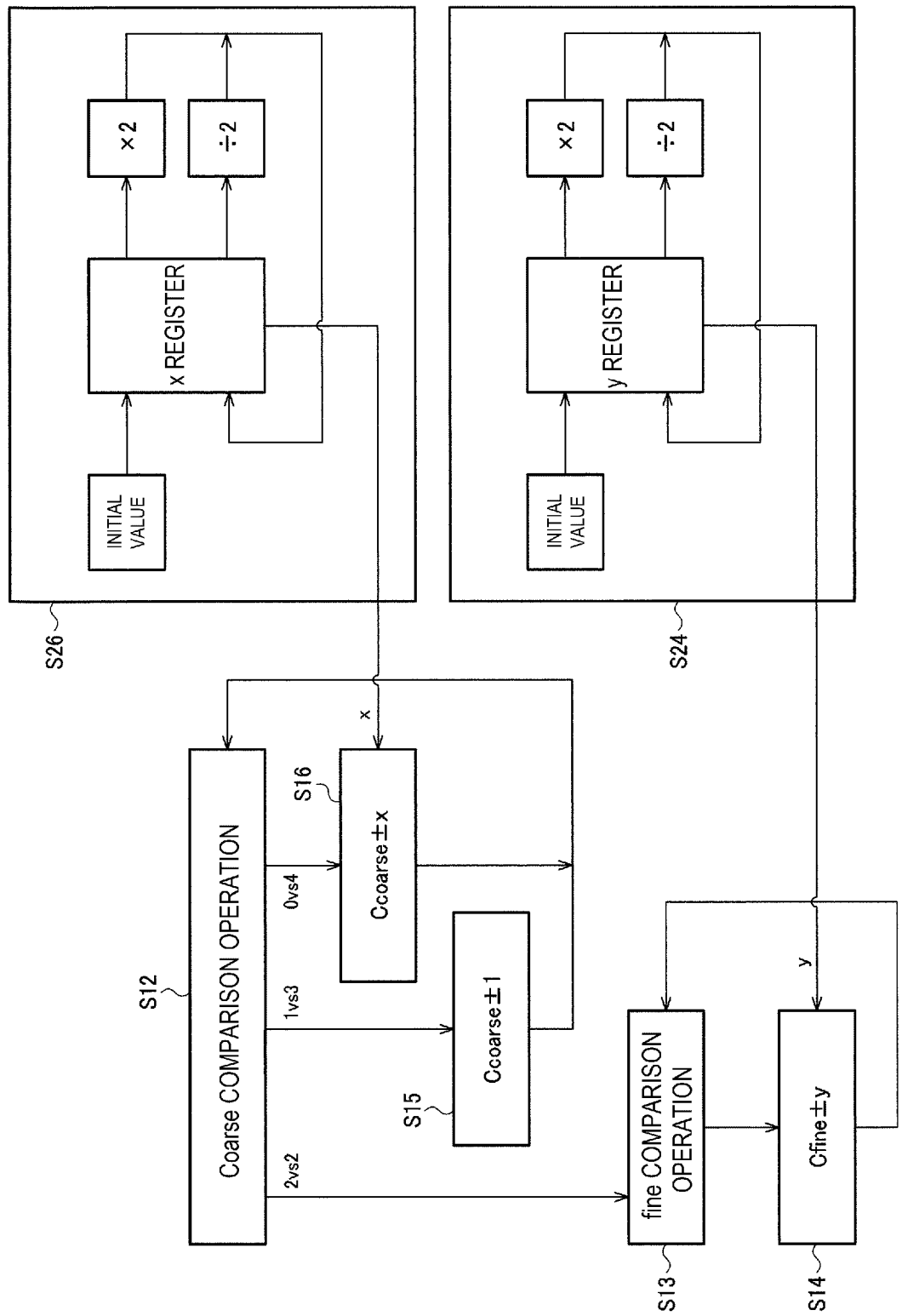
FIG. 16 is a state transition diagram in a turbo mode.

FIG. 16 is a state transition diagram in the turbo mode. Since states S12, S13, and S15 are substantially the same as the states S2, S3, and S5 shown in FIG. 15, the description thereof will be omitted.

In the state S12, when the comparison result is "0vs4," the processing circuit 40 determines the change step x in a state S26, and then updates the clock count Ccoarse in a state S16 using the change step x. In the state S26, the processing circuit 40 updates the change step x stored in an x register based on the phase comparison signals QCA through QCD. Specifically, when the comparison result in the previous measurement period and the comparison result in the current measurement period are unchanged but fixed to LLLL, or unchanged but fixed to HHHH, the processing circuit 40 doubles the change step x. When the comparison result in the previous measurement period and the comparison result in the current measurement period have changed from LLLL to HHHH, or have changed from HHHH to LLLL, the processing circuit 40 reduces the change step x to half.

In this way, since the change step x is doubled when the clock count Ccoarse is far from the true value, the change step x increases, and it is possible to accelerate the change in the clock count Ccoarse. In contrast, since the change step x is reduced to half when the clock count Ccoarse comes closer to the true value, the change step x becomes small, and the clock count Ccoarse converges with the true value.

In the fine judgment, a change step y is changed similarly to the coarse judgment described above. In other words, the processing circuit 40 determines the change step y in the state S24, and then updates the clock count Cfine in the state S14 using the change step y. In the state S24, the processing circuit 40 updates the change step y stored in a y register based on the phase comparison signal QF. Specifically, when the comparison result in the previous measurement period and the comparison result in the current measurement period are unchanged but fixed to L, or unchanged but fixed to H, the processing circuit 40 doubles the change step y. When the comparison result in the previous measurement period and the comparison result in the current measurement period have changed from L to H, or have changed from H to L, the processing circuit 40 reduces the change step y to half.

Figure 17:
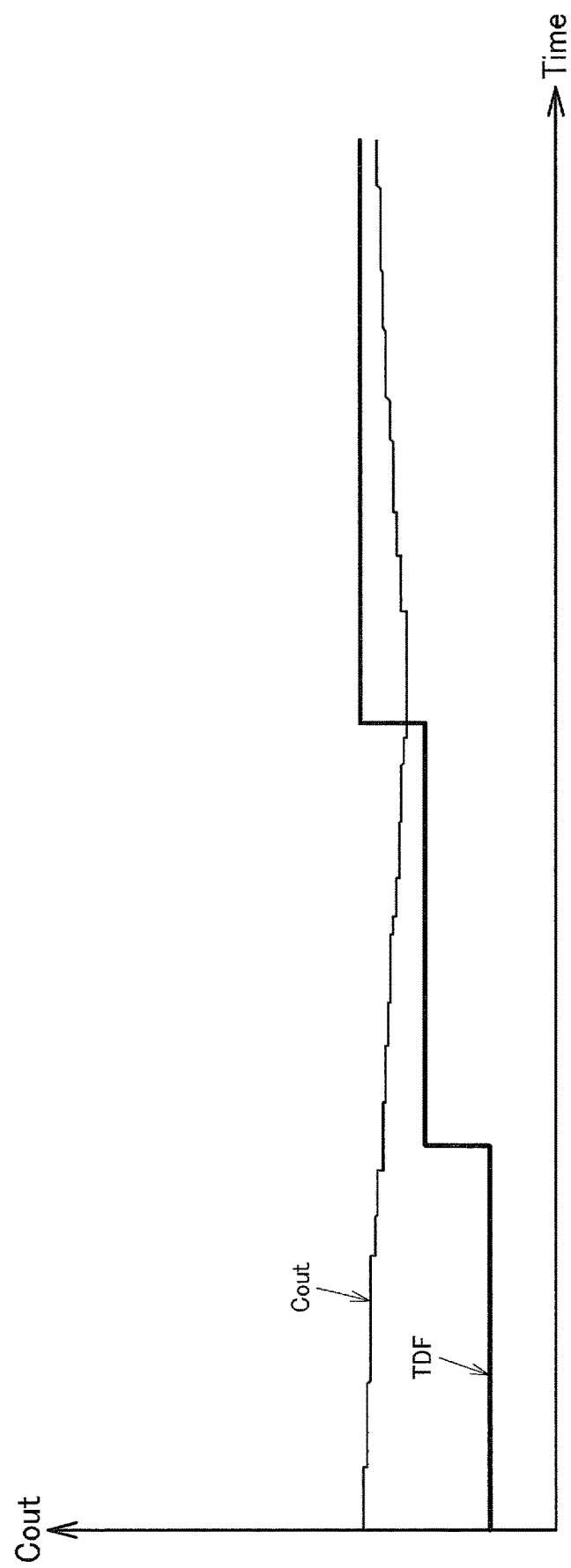
FIG. 17 is a diagram showing a waveform example when a change step of Cfine is fixed to 1.
Figure 18:
FIG. 18 is a diagram showing a waveform example when the turbo mode is used.

FIG. 17 shows a waveform example when the change step of the clock count Cfine is fixed to 1. Since the response of the digital value Cout to the change in the time difference TDF as the true value is slow, the digital value Cout fails to follow the true value. FIG. 18 shows a waveform example when using the turbo mode in the present embodiment. Since the response of the digital value Cout to the change in the time difference TDF has been speeded up, the followability to the true value is improved. Specifically, since the change step y is doubled when the clock count Cfine is far from the true value, the change step y increases, and it is possible to accelerate the change in the clock count Cfine. In contrast, since the change step y is reduced to half when the clock count Cfine comes closer to the true value, the change step y becomes small, and the clock count Cfine converges with the true value.

5. Physical Quantity Measurement Device, Electronic Apparatus, and Vehicle

Figure 19:
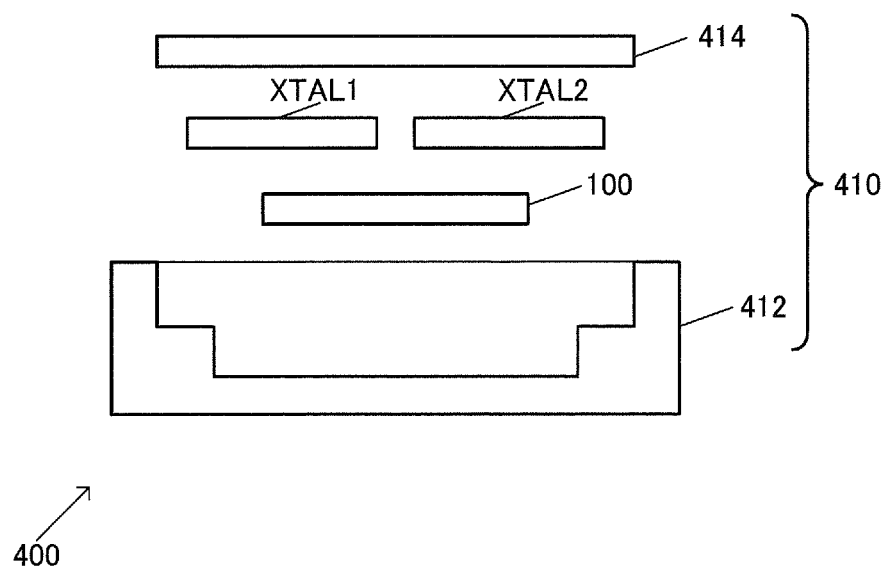
FIG. 19 is a diagram showing a configuration example of a physical quantity measurement device.

FIG. 19 shows a configuration example of a physical quantity measurement device 400 including the circuit device 100. The physical quantity measurement device 400 can be used for a ranging device for measuring a distance from an object as a physical quantity using, for example, a time-of-flight method. Alternatively, the physical quantity measurement device 400 can be used for an ultrasonograph which transmits an ultrasonic wave to an object and then receives the reflected wave to thereby measure the distance from the object as a physical quantity. In these examples, the time difference TDF in transition timing between the first signal STA and the second signal STP represents the distance from the object. It should be noted that the physical quantity measured by the physical quantity measurement device 400 is not limited to the time and the distance, but a variety of physical quantities such as a flow rate, flow speed, a frequency, speed, acceleration, angular velocity, and angular acceleration are conceivable.

As shown in FIG. 19, the physical quantity measurement device 400 includes the circuit device 100, the resonator XTAL1 for generating the clock signal CK1, and the resonator XTAL2 for generating the clock signal CK2. Further, it is possible for the physical quantity measurement device 400 to include a package 410 for housing the circuit device 100 and the resonators XTAL1, XTAL2. The package 410 is constituted by, for example, a base section 412 and a lid section 414. The base section 412 is a member made of an insulating material such as ceramic, and having, for example, a box-like shape, and the lid section 414 is a member to be bonded to the base section 412, and having, for example, a plate-like shape. For example, on the bottom surface of the base section 412, there are disposed external coupling terminals to be coupled to external equipment. In an internal space formed by the base section 412 and the lid section 414, there are housed the circuit device 100 and the resonators XTAL1, XTAL2. Further, by sealing the internal space with the lid section 414, the circuit device 100 and the resonators XTAL1, XTAL2 are airtightly encapsulated in the package 410. The circuit device 100 and the resonators XTAL1, XTAL2 are installed in the package 410. Further, terminals of the resonators XTAL1, XTAL2 and terminals of the circuit device 100 are electrically coupled respectively to each other with interconnections of the package 410.

It should be noted that although the example in which the circuit device 100 includes the oscillation circuits 11, 12 shown in FIG. 8 is illustrated in FIG. 19 as an example, it is possible for the circuit device 100 to include the oscillation circuit 13 and the fractional NPLL circuit 14 shown in FIG. 7. In this case, it is sufficient for the physical quantity measurement device 400 to include the single resonator XTAL.

Figure 20:
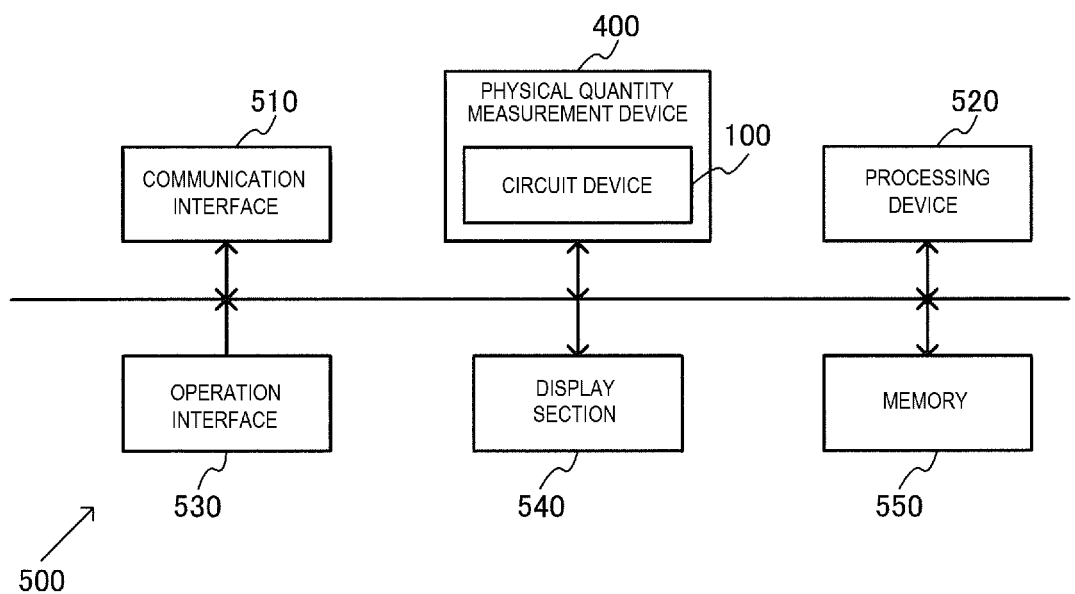
FIG. 20 is a diagram showing a configuration example of an electronic apparatus.

FIG. 20 shows a configuration example of an electronic apparatus 500 including the circuit device 100. The electronic apparatus 500 is, for example, a highly accurate measurement instrument for measuring a physical quantity such as a distance, time, flow speed, or a flow rate, a biological information measurement apparatus for measuring biological information, an in-car apparatus, or a robot. The biological information measurement apparatus is, for example, an ultrasonic measurement device. The in-car apparatus is an apparatus for automated driving, or the like.

As shown in FIG. 20, the electronic apparatus 500 includes the circuit device 100 and a processing device 520 for performing a process based on an output signal from the circuit device 100. The output signal can be a digital value as a measurement result of, for example, a time difference, or can also be a physical quantity other than the time obtained from the time difference. Specifically, the electronic apparatus 500 includes the physical quantity measurement device 400 having the circuit device 100, and the processing device 520 performs the process based on the physical quantity measured by the physical quantity measurement device 400. Further, the electronic apparatus 500 can include a communication interface 510, an operation interface 530, a display section 540, and a memory 550. It should be noted that the configuration of the electronic apparatus 500 is not limited to the configuration shown in FIG. 20, but it is possible to adopt a variety of modified implementations such as elimination of some of the constituents or addition of other constituents.

The communication interface 510 performs a process of receiving data from the outside and transmitting data to the outside. The processing device 520 as a processor performs a control process for the electronic apparatus 500, a variety of types of digital processing of the data transmitted or received via the communication interface 510, and so on. The function of the processing device 520 can be realized by a processor such as a microcomputer. The operation interface 530 is for a user to perform an input operation, and can be realized by operation buttons, a touch panel display, or the like. The display section 540 is for displaying a variety of types of information, and can be realized by a display using a liquid crystal, an organic EL, or the like. The memory 550 is for storing the data, and the function thereof can be realized by a semiconductor memory such as a RAM or a ROM.

Figure 21:
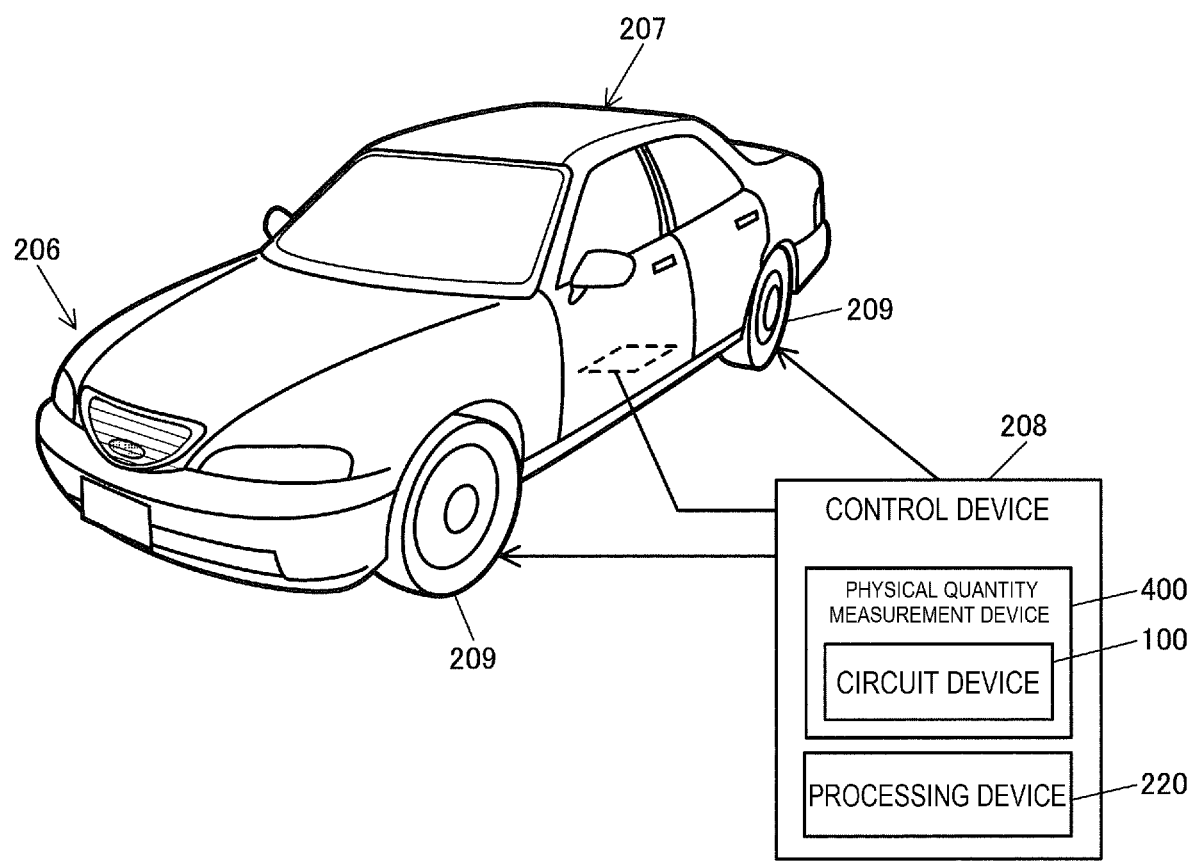
FIG. 21 is a diagram showing an example of a vehicle.

FIG. 21 shows an example of a vehicle including the circuit device 100. The vehicle includes the circuit device 100 and a processing device 220 for performing a process based on an output signal from the circuit device 100. The output signal can be a digital value as a measurement result of, for example, a time difference, or can also be a physical quantity other than the time obtained from the time difference. The circuit device 100 according to the present embodiment can be incorporated in a variety of vehicles such as a car, an airplane, a motorbike, a bicycle, a ship, or a boat. The vehicle is equipment or a device which is provided with a drive mechanism such as an engine or an electric motor, a steering mechanism such as a steering wheel or a helm, and a variety of electronic apparatuses, and moves on the ground, in the air, or on the sea.

FIG. 21 schematically shows a car 206 as a specific example of the vehicle. The vehicle 206 incorporates the circuit device 100. Specifically, the car 206 as the vehicle includes a control device 208. The control device 208 includes the physical quantity measurement device 400 having the circuit device 100, and the processing device 220 performing a process based on the physical quantity measured by the physical quantity measurement device 400. The control device 208 controls the stiffness of the suspension in accordance with, for example, the attitude of a car body 207, and controls the brake of each of wheels 209. For example, it is also possible to realize automated driving of the car 206 using the control device 208. It should be noted that the apparatus incorporating the circuit device 100 is not limited to such a control device 208, but the circuit device 100 can be incorporated in a variety of types of in-car equipment such as meter panel equipment or navigation equipment provided to a vehicle such as the car 206.

The circuit device according to the present embodiment described hereinabove includes the clock generation circuit, the signal generation circuit, the phase comparison circuit, and the processing circuit. The clock generation circuit generates the first clock signal and the second clock signal different in frequency from the first clock signal. The signal generation circuit generates the first signal making the transition at the transition timing of the first clock signal, the fine-judging signal making the transition at the transition timing of the second clock signal, the first coarse-judging signal making the transition at the transition timing of the second clock signal anterior to the fine-judging signal, and the second coarse-judging signal making the transition at the transition timing of the second clock signal posterior to the fine-judging signal. The phase comparison circuit performs the phase comparison between the second signal making the transition based on the first signal and the fine-judging signal to thereby output the first phase comparison signal, performs the phase comparison between the second signal and the first coarse-judging signal to thereby output the second phase comparison signal, and performs the phase comparison between the second signal and the second coarse-judging signal to thereby output the third phase comparison signal. The processing circuit sets the transition timing of the first signal and the transition timing of the fine-judging signal based on the first through third phase comparison signals, and then converts the time difference between the first signal and the second signal into the digital value based on the setting result.

According to the present embodiment, the signal generation circuit generates the first coarse-judging signal and the second coarse-judging signal. The phase comparison circuit compares the transition timings of the second signal and the first coarse-judging signal with each other, and compares the transition timings of the second signal and the second coarse-judging signal with each other. Based on this comparison result, the processing circuit converts the time difference between the first signal and the second signal into the digital value. Since the first and second coarse-judging signals are signals disposed anterior and posterior to the fine-judging signal, it is possible for the phase comparison circuit to determine whether or not the transition timings of the second signal and the fine-judging signal are distant more than one clock from each other. Thus, it is possible for the processing circuit to update the digital value by N, and the measurement period is shortened compared to when the digital value is updated by 1 as in the related art. Thus, it becomes possible to achieve an increase in dynamic range or an increase in resolution while suppressing an increase in the measurement period. It should be noted that the number N is the clock count of the first clock signal between the synchronizing timings of the first clock signal and the second clock signal.

Further, in the present embodiment, it is also possible for the signal generation circuit to change the transition timing of the first signal and the transition timing of the fine-judging signal based on the first phase comparison signal when the second phase comparison signal and the third phase comparison signal are in opposite signal levels to each other. It is also possible for the signal generation circuit to change the transition timing of the fine-judging signal when the second phase comparison signal and the third phase comparison signal are in the same signal level.

When the second phase comparison signal and the third phase comparison signal are in the opposite signal levels, the difference in transition timing between the second signal and the fine-judging signal is smaller than one clock. Therefore, by the signal generation circuit changing the transition timing of the first signal and the transition timing of the fine-judging signal, it is possible to make the transition timings of the fine-judging signal and the second signal come close to each other as much as a shorter time length than the clock period. Further, when the second phase comparison signal and the third phase comparison signal are in the same signal level, the difference in transition timing between the second signal and the fine-judging signal is longer than one clock. Therefore, by the signal generation circuit changing the transition timing of the fine-judging signal, it is possible to make the transition timings of the fine-judging signal and the second signal come close to each other as much as a time length longer than one clock.

Further, in the present embodiment, it is also possible for the signal generation circuit to change the transition timing of the first clock signal for making the transition of the first signal, and the transition timing of the second clock signal for making the transition of the fine-judging signal as much as the same clock count when the second phase comparison signal and the third phase comparison signal are in the opposite signal levels to each other. It is also possible for the signal generation circuit to change the transition timing of the first clock signal for making the transition of the first signal, and the transition timing of the second clock signal for making the transition of the fine-judging signal as much as respective clock counts different from each other when the second phase comparison signal and the third phase comparison signal are in the same signal level.

In this way, when the difference in transition timing between the second signal and the fine-judging signal is smaller than one clock, by the signal generation circuit changing the transition timing of the first signal and the transition timing of the fine-judging signal as much as the same clock count, it is possible to make the transition timings of the fine-judging signal and the second signal come close to each other as much as an integral multiple of the period difference $\Delta t$. The period difference $\Delta t$ is the difference in period between the first clock signal and the second clock signal. The integral multiple is a multiple no smaller than 1. Further, when the transition timings of the second signal and the fine-judging signal are distant more than one clock from each other, by changing the transition timing of the first signal and the transition timing of the fine-judging signal as much as the same clock count, it is possible to make the transition timings of the fine-judging signal and the second signal come close to each other as much as a time length longer than one clock.

Further, in the present embodiment, it is possible for the circuit device to include a register for storing the first clock count and the second clock count. It is possible for the signal generation circuit to make the transition of the first signal at the transition timing in the first clock count of the first clock signal from the synchronizing timing at which the phase of the first clock signal and the phase of the second clock signal are synchronized with each other. It is possible for the signal generation circuit to make the transition of the fine-judging signal at the transition timing in the clock count obtained by adding the first clock count and the second clock count of the second clock signal from the synchronizing timing. It is possible for the processing circuit to update the first clock count and the second clock count to be stored in the register based on the first through third phase comparison signals.

In this way, it is possible to express the time difference between the first signal and the second signal using the first clock count and the second clock count. In other words, by the processing circuit updating the first clock count and the second clock count to be stored in the register based on the first through third phase comparison signals, the transition timings of the second signal and the fine-judging signal coincide with each other. On this occasion, the time difference between the first signal and the second signal is measured as (first clock count)×$\Delta t$+(second clock count)×N×$\Delta t$.

Further, in the present embodiment, when the second phase comparison signal and the third phase comparison signal are in the opposite signal levels to each other, it is possible for the processing circuit to update the first clock count based on the first phase comparison signal while keeping the second clock count, and it is possible for the signal generation circuit to change the transition timing of the first signal and the transition timing of the fine-judging signal based on the first clock count updated by the processing circuit and the second clock count thus kept. When the second phase comparison signal and the third phase comparison signal are in the same signal level, it is possible for the processing circuit to keep the first clock count while updating the second clock count, and it is possible for the signal generation circuit to change the transition timing of the fine-judging signal without changing the transition timing of the first signal based on the first clock count kept by the processing circuit and the second clock count thus updated.

As described above, the transition timing of the first signal is determined by the first clock count, and the transition timing of the fine-judging signal is determined by the first clock count and the second clock count. Therefore, by the processing circuit updating the first clock count, the transition timing of the first signal and the transition timing of the fine-judging signal change as much as the same clock count. Further, by the processing circuit updating the second clock count, the transition timing of the first signal and the transition timing of the fine-judging signal change as much as respective clock counts different from each other. Specifically, the transition timing of the first signal does not change, and the transition timing of the fine-judging signal changes.

Further, in the present embodiment, it is possible for the processing circuit to obtain the digital value based on the first clock count and the second clock count.

As described above, the time difference between the first signal and the second signal is expressed as (first clock count)×$\Delta t$+(second clock count)×N×$\Delta t$. In other words, the digital value to be obtained by the processing circuit is expressed as (first clock count)+(second clock count)×N.

Further, in the present embodiment, it is possible for the processing circuit to include the dither circuit for outputting the dither value. It is possible for the processing circuit to add the dither value to the first clock count to thereby update the first clock count.

In this way, since the first clock count is updated with the dither value, the measurement time is shortened compared to when the first clock count is updated by 1.

Further, in the present embodiment, it is possible for the signal generation circuit to generate the third coarse-judging signal making the transition at the transition timing of the second clock signal anterior to the first coarse-judging signal, and the fourth coarse-judging signal making the transition at the transition timing of the second clock signal posterior to the second coarse-judging signal. It is possible for the phase comparison circuit to perform the phase comparison between the second signal and the third coarse-judging signal to thereby output the fourth phase comparison signal, and perform the phase comparison between the second signal and the fourth coarse-judging signal to thereby output the fifth phase comparison signal. It is possible for the processing circuit to set the transition timing of the first signal and the transition timing of the fine-judging signal based on the first through fifth phase comparison signals, and then convert the time difference between the first signal and the second signal into the digital value based on the setting result.

Since the third and fourth coarse-judging signals are signals disposed anterior and posterior to the first and second coarse-judging signals, it is possible for the phase comparison circuit to determine whether or not the transition timings of the second signal and the fine-judging signal are distant more than two clocks from each other. Thus, it is possible for the processing circuit to determine whether the transition timings of the second signal and the fine-judging signal are distant as much as one clock or distant more than two clocks from each other. For example, it is possible for the processing circuit to variably control the change step of the second clock count based on the determination result in such a manner as described below.

Further, in the present embodiment, it is possible for the processing circuit to variably control the change step of the second clock count based on the second through fifth phase comparison signals to change the second clock count as much as the change step to thereby update the second clock count.

As described above, it is possible for the processing circuit to determine whether the transition timings of the second signal and the fine-judging signal are distant as much as one clock or distant more than two clocks based on the second through fifth phase comparison signals, and to variably control the change step of the second clock count based on the determination result. Thus, it is possible for the processing circuit to increase the change step when the transition timings of the second signal and the fine-judging signal are far from each other, or decrease the change step when the transition timings of the second signal and the fine-judging signal are close to each other. Thus, the measurement time can further be reduced.

Further, in the present embodiment, it is possible for the clock generation circuit to have the oscillation circuit for oscillating the resonator to thereby generate the second clock signal, and the fractional NPLL circuit for generating the first clock signal based on the second clock signal.

In this way, by the fractional NPLL circuit generating the first clock signal based on the second clock signal, there are generated the first clock signal and the second signal different in frequency from each other.

Further, in the present embodiment, it is possible for the clock generation circuit to have the first oscillation circuit for oscillating the first resonator to thereby generate the first clock signal, and the second oscillation circuit for oscillating the second resonator to thereby generate the second clock signal.

In this way, by the first oscillation circuit oscillating the first resonator to thereby generate the first clock signal, and by the second oscillator circuit oscillating the second resonator to thereby generate the second clock signal, the first clock signal and the second clock signal different in frequency from each other are generated.

Further, the physical quantity measurement device according to the present embodiment includes the circuit device described above and the resonator.

Further, it is possible for the physical quantity measurement device according to the present embodiment to include the circuit device described above, the first resonator, and the second resonator.

Further, the electronic apparatus according to the present embodiment includes any one of the circuit devices described above, and the processing device which performs an operation based on the output signal from the circuit device.

Further, the vehicle according to the present embodiment includes any one of the circuit devices described above, and the processing device which performs an operation based on the output signal from the circuit device.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with the different term in any part of the specification or the accompanying drawings. Further, all of the combinations of the present embodiment and the modified examples are also included in the scope of the present disclosure. Further, the configurations, the operations and so on of the circuit device, the physical quantity measurement device, the electronic apparatus, the vehicle, and so on are not limited to those explained in the present embodiment, but can be implemented with a variety of modifications.

What is claimed is:

1. A circuit device comprising:
  a clock generation circuit configured to generate a first clock signal and a second clock signal different in frequency from the first clock signal;
  a signal generation circuit configured to generate a first signal making a transition at a transition timing of the first clock signal, a fine-judging signal making a transition at a transition timing of the second clock signal, a first coarse-judging signal making a transition at a transition timing of the second clock signal anterior to the fine-judging signal, and a second coarse-judging signal making a transition at a transition timing of the second clock signal posterior to the fine-judging signal;
  a phase comparison circuit configured to perform a phase comparison between a second signal making a transition based on the first signal and the fine-judging signal to thereby output a first phase comparison signal, perform a phase comparison between the second signal and the first coarse-judging signal to thereby output a second phase comparison signal, and perform a phase comparison between the second signal and the second coarse-judging signal to thereby output a third phase comparison signal; and
  a processing circuit configured to set a transition timing of the first signal and a transition timing of the fine-judging signal based on the first phase comparison signal, the second phase comparison signal, and the third phase comparison signal, and then convert a time difference between the first signal and the second signal into a digital value based on a result of the setting.

2. The circuit device according to claim 1, wherein
the signal generation circuit changes the transition timing of the first signal and the transition timing of the fine-judging signal based on the first phase comparison signal when the second phase comparison signal and the third phase comparison signal are in opposite signal levels, and changes the transition timing of the fine-judging signal when the second phase comparison signal and the third phase comparison signal are in a same signal level.

3. The circuit device according to claim 2, wherein
the signal generation circuit changes the transition timing of the first clock signal for making the transition of the first signal and the transition timing of the second clock signal for making the transition of the fine-judging signal as much as a same clock count when the second phase comparison signal and the third phase comparison signal are in the opposite signal levels, and changes the transition timing of the first clock signal for making the transition of the first signal and the transition timing of the second clock signal for making the transition of the fine-judging signal as much as respective clock counts different from each other when the second phase comparison signal and the third phase comparison signal are in the same signal level.

4. The circuit device according to claim 1 further comprising:
a register configured to store a first clock count and a second clock count, wherein
the signal generation circuit makes the transition of the first signal at a transition timing in the first clock count of the first clock signal from a synchronizing timing at which the first clock signal and the second clock signal coincide in phase with each other, and makes the transition of the fine-judging signal at a transition timing in a clock count obtained by adding the first clock count and the second clock count to each other of the second clock signal from the synchronizing timing, and
the processing circuit updates the first clock count and the second clock count to be stored in the register based on the first phase comparison signal, the second phase comparison signal and the third phase comparison signal.

5. The circuit device according to claim 4, wherein
when the second phase comparison signal and the third phase comparison signal are in the opposite signal levels, the processing circuit updates the first clock count based on the first phase comparison signal while keeping the second clock count, and the signal generation circuit changes the transition timing of the first signal and the transition timing of the fine-judging signal based on the first clock count updated by the processing circuit and the second clock count kept, and
when the second phase comparison signal and the third phase comparison signal are in the same signal level, the processing circuit keeps the first clock count while updating the second clock count, and the signal generation circuit changes the transition timing of the fine-judging signal without changing the transition timing of the first signal based on the first clock count kept by the processing circuit and the second clock count updated.

6. The circuit device according to claim 4, wherein
the processing circuit obtains the digital value based on the first clock count and the second clock count.

7. The circuit device according to claim 4, wherein
the processing circuit includes a dither circuit configured to output a dither value, and adds the dither value to the first clock count to thereby update the first clock count.

8. The circuit device according to claim 4, wherein
the signal generation circuit generates a third coarse-judging signal making a transition at a transition timing of the second clock signal anterior to the first coarse-judging signal, and a fourth coarse-judging signal making a transition at a transition timing of the second clock signal posterior to the second coarse-judging signal, the phase comparison circuit performs a phase comparison between the second signal and the third coarse-judging signal to thereby output a fourth phase comparison signal, and performs a phase comparison between the second signal and the fourth coarse-judging signal to thereby output a fifth phase comparison signal, and
the processing circuit sets the transition timing of the first signal and the transition timing of the fine-judging signal based on the first phase comparison signal, the second phase comparison signal, the third phase comparison signal, the fourth phase comparison signal, and the fifth phase comparison signal, and converts the time difference between the first signal and the second signal into the digital value based on a result of the setting of the transition timing of the first signal and the transition timing of the fine-judging signal.

9. The circuit device according to claim 8, wherein
the processing circuit variably controls a change step of the second clock count based on the second phase comparison signal, the third phase comparison signal, the fourth phase comparison signal, and the fifth phase comparison signal, and changes the second clock count as much as the change step to thereby update the second clock count.

10. The circuit device according to claim 1, wherein
the clock generation circuit includes
an oscillation circuit configured to oscillate a resonator to thereby generate the second clock signal, and
a fractional NPLL circuit configured to generate the first clock signal based on the second clock signal.

11. The circuit device according to claim 1, wherein
the clock generation circuit includes
a first oscillation circuit configured to oscillate a first resonator to thereby generate the first clock signal, and
a second oscillation circuit configured to oscillate a second resonator to thereby generate the second clock signal.

12. A physical quantity measurement device comprising:
the circuit device according to claim 10; and
the resonator.

13. A physical quantity measurement device comprising:
the circuit device according to claim 11;
the first resonator; and
the second resonator.

14. An electronic apparatus comprising:
the circuit device according to claim 1; and
a processing device configured to execute a process based on an output signal from the circuit device.

15. A vehicle comprising:
the circuit device according to claim 1; and
a processing device configured to execute a process based on an output signal from the circuit device.

* * * * *